United States Patent
Hayashida et al.

(10) Patent No.: US 10,756,189 B2
(45) Date of Patent: Aug. 25, 2020

(54) SEMICONDUCTOR DEVICE

(71) Applicant: Mitsubishi Electric Corporation, Chiyoda-ku (JP)

(72) Inventors: Tetsuro Hayashida, Tokyo (JP); Takuma Nanjo, Tokyo (JP); Tatsuro Watahiki, Tokyo (JP); Akihiko Furukawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/474,720

(22) PCT Filed: Feb. 10, 2017

(86) PCT No.: PCT/JP2017/004902
§ 371 (c)(1),
(2) Date: Jun. 28, 2019

(87) PCT Pub. No.: WO2018/146791
PCT Pub. Date: Aug. 16, 2018

(65) Prior Publication Data
US 2020/0127099 A1 Apr. 23, 2020

(51) Int. Cl.
*H01L 29/20* (2006.01)
*H01L 29/66* (2006.01)
(Continued)

(52) U.S. Cl.
CPC ........ *H01L 29/2003* (2013.01); *H01L 29/407* (2013.01); *H01L 29/66136* (2013.01);
(Continued)

(58) Field of Classification Search
CPC ............... H01L 29/2003; H01L 29/407; H01L 29/66136; H01L 29/66212; H01L 29/8613; H01L 29/8725
(Continued)

(56) References Cited

U.S. PATENT DOCUMENTS

2012/0056196 A1* 3/2012 Ota ..................... H01L 29/1608
257/77
2013/0087835 A1 4/2013 Edwards et al.
2018/0097123 A1* 4/2018 Kajitani ................ H01L 29/122

FOREIGN PATENT DOCUMENTS

JP          49-34274        9/1974
JP          2015-79922 A    4/2015
WO     WO 2016/185645 A1   11/2016

OTHER PUBLICATIONS

International Search Report dated Apr. 11, 2017 in PCT/JP2017/004902 filed on Feb. 10, 2017.
(Continued)

*Primary Examiner* — Tong-Ho Kim
(74) *Attorney, Agent, or Firm* — Xsensus LLP

(57) ABSTRACT

A substrate is made of gallium-nitride-based material. The n-type layer is disposed on a first surface of the substrate. A p-type layer is disposed on the n-type layer, and constitutes, along with the n-type layer, a semiconductor layer on the first surface of the substrate, the semiconductor layer being provided with a mesa shape having a bottom surface, a side surface, and a top surface. An anode electrode is disposed on the p-type layer. A cathode electrode is disposed on a second surface of the substrate. An insulating film continuously extends over the bottom surface and the top surface to cover the side surface. The top surface is provided with at least one trench. The at least one trench includes a trench filled with the insulating film.

10 Claims, 21 Drawing Sheets

(51) Int. Cl.
    *H01L 29/861*     (2006.01)
    *H01L 29/872*     (2006.01)
    *H01L 29/40*     (2006.01)

(52) U.S. Cl.
    CPC .... *H01L 29/66212* (2013.01); *H01L 29/8613* (2013.01); *H01L 29/8725* (2013.01)

(58) Field of Classification Search
    USPC ........................................................ 257/367
    See application file for complete search history.

(56) References Cited

OTHER PUBLICATIONS

Japanese Office Action dated Jul. 25, 2017 in Japanese Patent Application No. 2017-533356, (with unedited computer-generated English translation).
Ohta, H. et al., "Vertical GaN p-n Junction Diodes With High Breakdown Voltages Over 4 kV", IEEE Electron Device Letters, vol. 36, No. 11, Nov. 2015, pp. 1180-1182.
Kajitani, R. et al., "A High Current Operation in a 1.6kV GaN-based Trenched Junction Barrier Schottky (JBS) Diode", 2015 International Conference on Solid State Devices and Materials, Sapporo, 2015, pp. 1056-1057.

* cited by examiner

F I G . 1 7
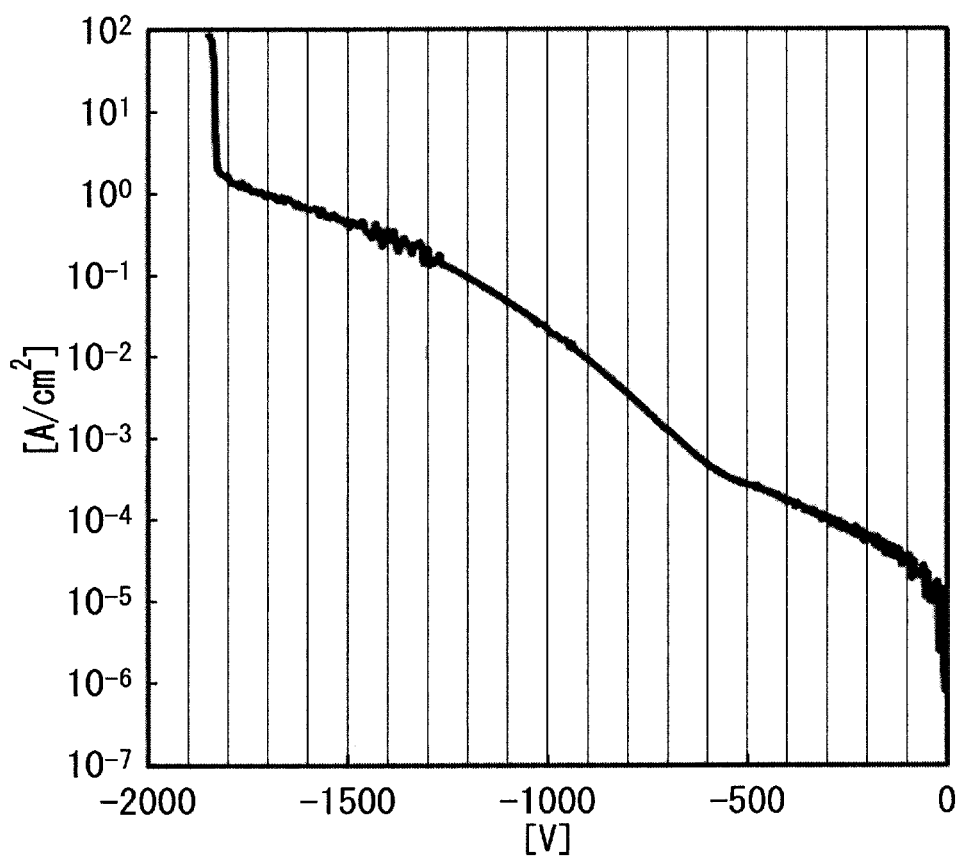

SEMICONDUCTOR DEVICE

TECHNICAL FIELD

The present invention relates to semiconductor devices, and particularly, to a semiconductor device made of gallium-nitride-based material.

BACKGROUND ART

Developments have been recently active in semiconductor devices using wide bandgap semiconductors. A gallium-nitride (GaN)-based material is particularly a promising wide bandgap semiconductor. GaN, which has higher resistance to dielectric breakdown and higher electron mobility than silicon (Si), is receiving attention as the material of a substrate for fabricating a rectification element and a switching element, which are power devices. GaN can be used to manufacture high-voltage and low-resistant field effect transistors (FETs), Schottky barrier diodes (SBDs), and PN diodes (PNDs).

GaN, when used as a substrate material, unfortunately disfavors formation of a highly active p-type diffusion layer through ion implantation, unlike Si and silicon carbide (SiC), which are typical materials for a power device. Hence, unlike Si and SiC, GaN cannot form a p-type field-reducing structure, typically, a p-type guard ring (also referred to as a p-type field-limiting ring or p-type FLR for short) structure through impurity implantation. A possible way to form the p-type field-reducing structure is forming and patterning a p-type epitaxial-growth layer instead of implanting acceptor impurity ions. Moreover, the field-reducing structure is possibly formed using a field plate structure.

For instance, Patent Document 1 discloses a horizontal SBD. This diode has a field plate structure provided with a stair structure to further distribute field concentration. With such a structure, Patent Document 1 attempts to enhance breakdown voltage.

Further, Non-Patent Document 1 discloses a vertical PN diode. This diode has a slanted filed plate structure consisting of a combination of a mesa-shaped GaN layer, and a spin-on-glass (SOG) film, which exerts a planarization effect. This structure enables a structure for reducing field concentration to be formed through a simple process.

Still further, Non-Patent Document 2 discloses a vertical junction-barrier-Schottky (JBS) diode. This diode has an n-GaN layer and a p-GaN layer on the n-GaN layer. The p-GaN layer is partly removed, bringing an anode electrode into contact with the n-GaN layer and the p-GaN layer. In this structure, the p-GaN layer reduces the electric field at the Schottky interface between the anode electrode and the n-GaN layer. With such a structure, Non-Patent Document 2 attempts to enhance breakdown voltage. The anode electrode has an end spaced away from a semiconductor region by a passivation layer.

PRIOR ART DOCUMENTS

Patent Document

Patent Document 1: Japanese Patent Application Laid-Open No. 2015-79922

Non-Patent Documents

Non-Patent Document 1: Hiroshi Ohta et al., "Vertical GaN p-n Junction Diodes With High Breakdown Voltages over 4 kV", IEEE Electron Device Letters, vol. 36, no. 11, November 2015

Non-Patent Document 2: Ryo Kajitani et al., "A High Current Operation in a 1.6 KV GaN-based Trenched Junction Barrier Schottky (JBS) Diode", SSDM 2015 M-3-3

SUMMARY

Problem to be Solved by the Invention

A vertical GaN power device having a field plate structure tends to exhibit field concentration at the end of a field plate electrode. Enhancing the breakdown voltage of the device requires an insulating film to be thick below the outer periphery of the field plate electrode. On the other hand, maintaining the effect of the field plate structure at a high level requires the insulating film to be kept thin near an anode electrode. A conventional technique has difficulty in forming an insulating film with such film distribution through a simple method.

For instance, the method in Patent Document 1 needs more stair structures to further enhance the breakdown voltage. This requires further process steps for film formation, lithography, and etching. Process costs consequently increase. In addition, increased process steps reduce yields.

For instance, the method in Non-Patent Document 1 only forms, through one-time application, an SOG film having a small thickness of about 400 nm. With this thickness, a breakdown voltage of the order of several kilo volts is difficult to maintain. In the technique in Non-Patent Document 1, a $SiO_2$ film is further layered on the SOG film through sputtering. The insulating film is thus thick as a whole. The $SiO_2$ film formed through sputtering unfortunately does not exert a planarization effect, unlike the SOG film formed through application. Hence, if the $SiO_2$ film is thick, the insulating film is thick not only below the outer periphery of the field plate, but also at the end of the top surface of the mesa shape. That is, the insulating film is thick near the anode electrode as well. The effect of the field plate consequently reduces. The SOG film, if formed of multiple layers, would increase the thickness of the insulating film while sufficiently exerting the planarization effect. Here, achieving an SOG film of sufficient film quality requires annealing and curing. The SOG film contracts during the annealing and curing, thus easily generating cracking, because the film receives a larger stress along with increases in the film thickness. This can consequently lead to peeling of the SOG film. With this method, it is thus difficult to increase the thickness of the SOG film while maintaining the slanted field plate structure.

For instance, Non-Patent Document 2 fails to describe a method of regulating the thickness of the passivation layer, which is an insulating film, in accordance with the position of the passivation layer. The thickness of the insulating film is thus considered uniform. In this case, an electric field is not sufficiently distributed in the outer periphery of the p-GaN layer, which serves as a guard ring. This tends to generate a large leakage current when a reverse voltage is applied.

To solve such problems, it is a main object of the present invention to provide a semiconductor device that enhances its breakdown voltage through simple manufacturing steps.

Means to Solve the Problem

A semiconductor device in the present invention has a substrate, an n-type layer, a p-type layer, an anode electrode, a cathode electrode, and an insulating film. The substrate has a first surface and a second surface opposite to the first surface, and is made of gallium-nitride-based material. The n-type layer is disposed on the first surface of the substrate. The p-type layer is disposed on the n-type layer, and constitutes, along with the n-type layer, a semiconductor layer on the first surface of the substrate, the semiconductor layer being provided with a mesa shape having a bottom surface, a side surface, and a top surface. The anode electrode is disposed on the p-type layer. The cathode electrode is disposed on the second surface of the substrate. The insulating film continuously extends over the bottom surface and the top surface to cover the side surface. The top surface is provided with at least one trench. The at least one trench includes a trench filled with the insulating film.

Effects of the Invention

According to the present invention, the insulating film is filled in the trench, thereby exerting its anchor effect. This prevents the insulating film from peeling. Accordingly, when the kind of the insulating film is selected, emphasis can be put not on peeling prevention, but on the easiness of obtaining the distribution of the film thickness suitable for achieving a high breakdown voltage. This enhances the breakdown voltage through simple manufacturing steps.

These and other objects, features, aspects and advantages of the Description will become more apparent from the following detailed description of the Description when taken in conjunction with the accompanying drawings.

BRIEF DESCRIPTION OF DRAWINGS

FIG. 17 is a graph showing the relationship between reverse voltage and current density that were measured with regard to the semiconductor device in the embodiment.

DESCRIPTION OF EMBODIMENT(S)

Figure 1:
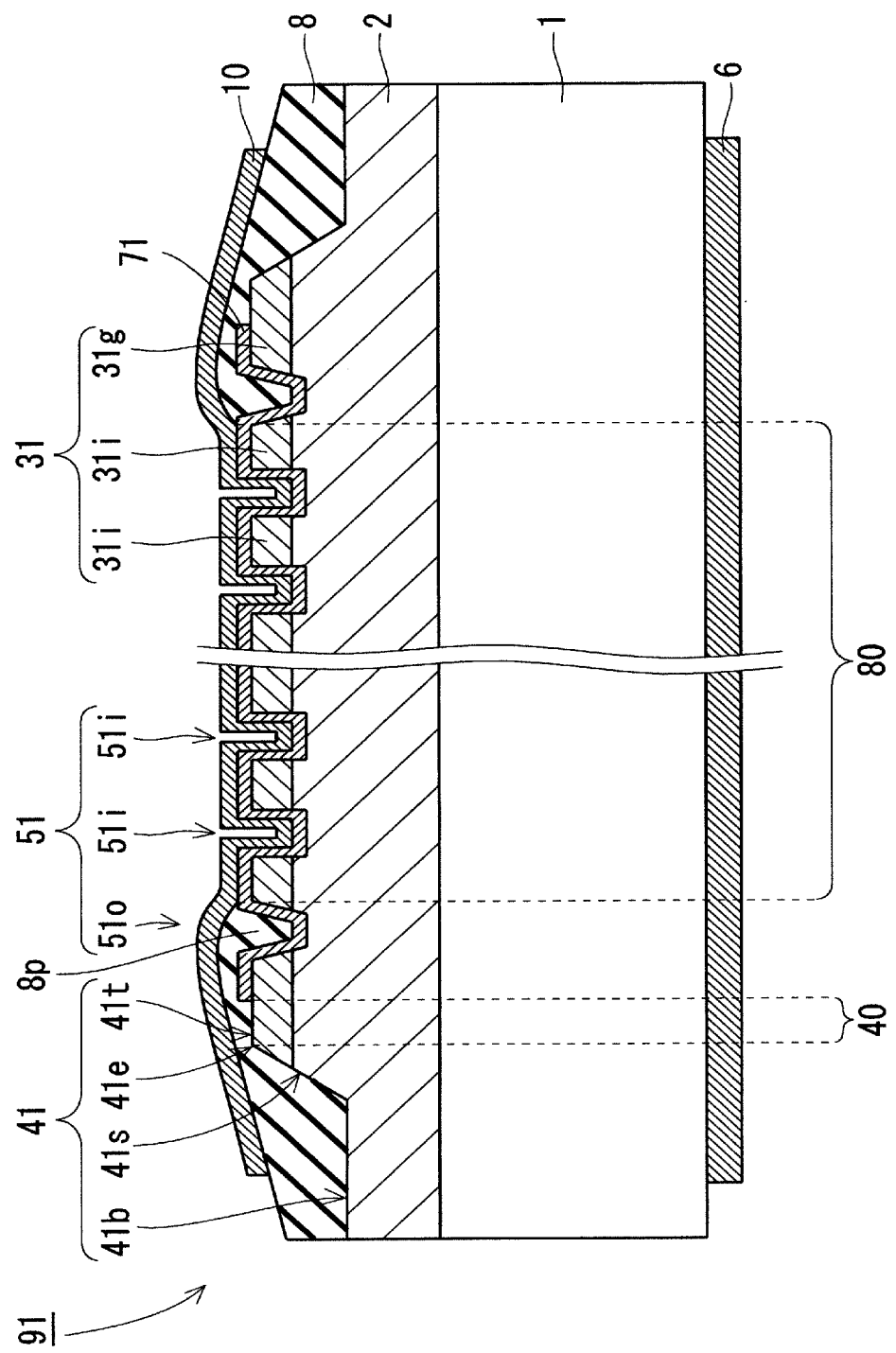
FIG. 1 is a cross-sectional view schematically illustrating the configuration of a semiconductor device according to a first embodiment of the present invention.

The following describes the embodiments of the present invention with reference to the accompanying drawings. Identical or corresponding components in the drawings are denoted by the same reference sings, and will not be elaborated upon. For easy understanding, individual members or the scales of the individual members in the drawings can be different from those in practical use; this fact is also applicable between the drawings.

First Embodiment (Configuration)

Figure 2:
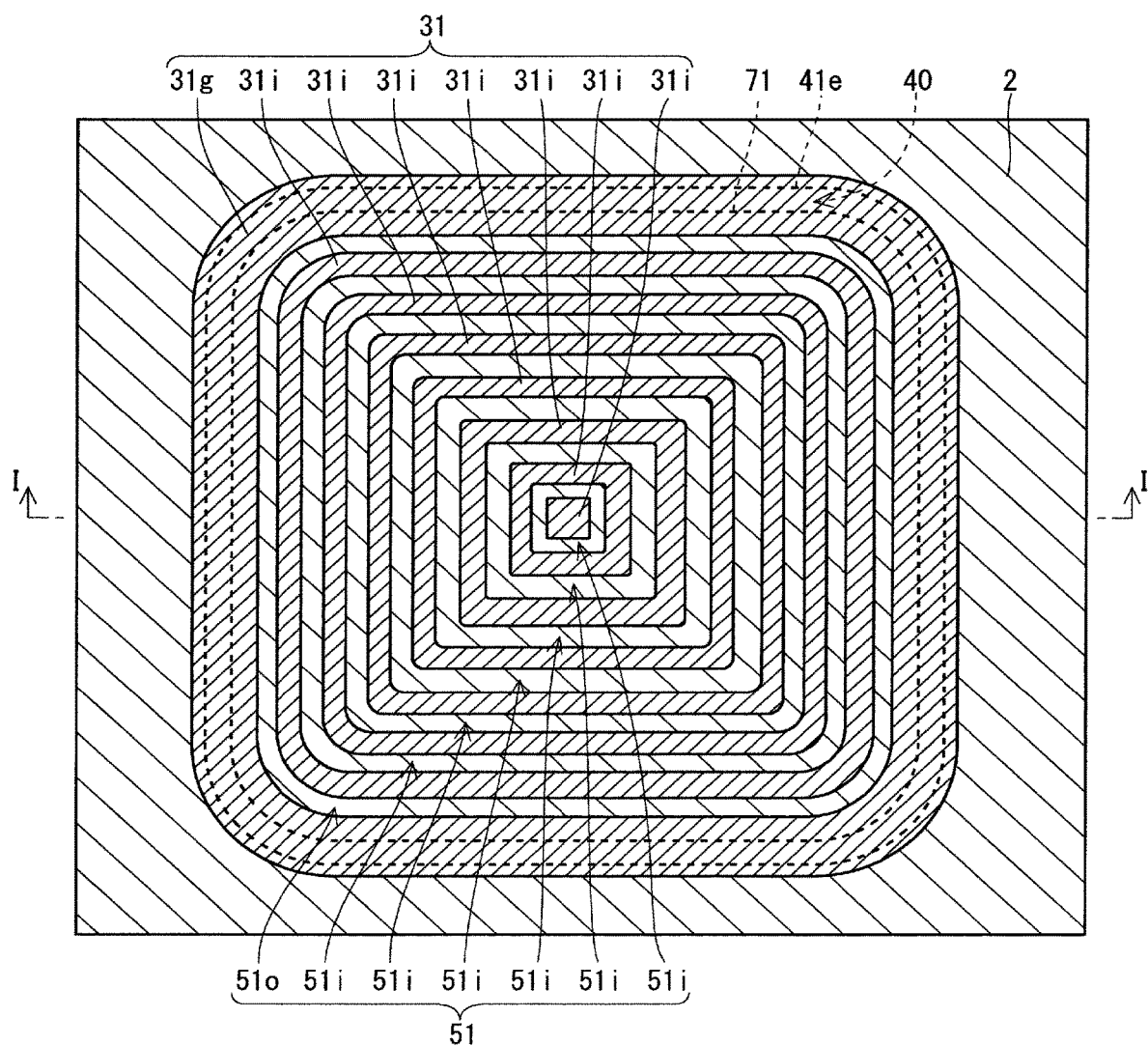
FIG. 2 is a plan view schematically illustrating the configuration of a semiconductor layer included in the semiconductor device in FIG. 1.

FIG. 1 is a cross-sectional view schematically illustrating the configuration of a diode 91 (i.e., semiconductor device) according to a first embodiment. FIG. 2 is a plan view schematically illustrating the configuration of a semiconductor layer included in the diode 91. Although FIG. 2 is a plan view, the drawing is hatched for easy illustration, just as the cross-sectional view in FIG. 1. The diode 91 has an n-type GaN substrate 1 (i.e., substrate), an n-type GaN epitaxial-growth layer 2 (i.e., n-type layer), a p-type GaN epitaxial-growth layer 31 (i.e., p-type layer), an anode electrode 71, a cathode electrode 6, an insulating film 8, and a field plate electrode 10.

The n-type GaN substrate 1 is a monocrystalline substrate having an upper surface (i.e., first surface) and a lower surface (i.e., second surface opposite to the first surface). The n-type GaN epitaxial-growth layer 2 (i.e., n-type layer) is disposed on the upper surface of the n-type GaN substrate 1.

The p-type GaN epitaxial-growth layer 31 (i.e., p-type layer) is disposed on the n-type GaN epitaxial-growth layer 2. The p-type GaN epitaxial-growth layer 31 constitutes, along with the n-type GaN epitaxial-growth layer 2, a semiconductor layer on the upper surface of the n-type GaN substrate 1. The semiconductor layer has a multi-layer structure. The semiconductor layer is provided with a mesa shape 41. The mesa shape 41 has a bottom surface 41b, a side surface 41s, and a top surface 41t. The bottom surface 41b is positioned lower (i.e., deeper) than the top surface 41*t*. The side surface 41*s* connects the bottom surface 41*b* and the top surface 41*t* together. The top surface 41*t* has a termination 41*e*. The termination 41*e* is the outer edge of the top surface 41*t*, that is, the boundary between the top surface 41*t* and the side surface 41*s*. The mesa shape 41 is preferably rectangular or forward tapered. With regard to the mesa shape, the term "forward tapered" herein means that the mesa shape 41 has a shape tapered toward a direction in which the mesa shape 41 protrudes. In other words, the term "forward tapered" means a structure in which the end of the bottom surface 41*b* further protrudes in a direction away from the center of a pattern than the end of the top surface 41*t*.

The top surface 41*t* is provided with at least one trench. The at least one trench includes a trench filled with the insulating film 8. In the present embodiment, provided are a plurality of trenches 51: an outer trench 51*o* and an inner trench 51*i*. The outer trench 51*o* is disposed near the termination 41*e* on the top surface 41*t* of the mesa shape 41 so as to extend along the termination 41*e* (c.f., FIG. 2). The inner trench 51*i* is disposed inside the outer trench 51*o* on the top surface 41*t*. The outer trench 51*o* is filled with the insulating film 8 via the anode electrode 71. In other words, the insulating film 8 has an anchor structure 8*p* in the outer trench 51*o*.

In the plane layout in FIG. 2, the trenches 51 are arranged in the form of lines and spaces. To be specific, the trenches 51 each having a ring shape are arranged in layers. The term "ring shape" herein is a shape extending along a closed curve.

The anode electrode 71 is disposed on the p-type GaN epitaxial-growth layer 31 and the n-type GaN epitaxial-growth layer 2, on the top surface 41*t* of the mesa shape 41. The anode electrode 71 is in Schottky contact with the n-type GaN epitaxial-growth layer 2 in the trenches 51. The diode 91 is thus a kind of SBD.

The cathode electrode 6 is disposed on the lower surface of the n-type GaN substrate 1. Thus, the anode electrode 71 and the cathode electrode 6, which are the main electrodes of the diode, are provided to sandwich the n-type GaN substrate 1 in the thickness direction of the n-type GaN substrate 1. The diode 91 is thus a vertical semiconductor device. The cathode electrode 6 is in ohmic contact with the lower surface of the n-type GaN substrate 1.

The p-type GaN epitaxial-growth layer 31 has an inner region 31*i* and a guard ring region 31*g*. In the plane layout (c.f., FIG. 2), the inner region 31*i* is disposed inside the guard ring region 31*g*. The inner region 31*i* has a function of extending a depletion layer into the n-type GaN substrate under the application of a reverse voltage. The diode 91 is thus a kind of JBS diode. The inner region 31*i* can serve as a p-type region of a PND under the application of a sufficiently high forward voltage. In this case, the diode 91 is considered to be a kind of merged-PiN Schottky (MPS) diode. The guard ring region 31*g* is electrically connected to the anode electrode 71, and is preferably in ohmic contact with the anode electrode 71. In the plane layout, the guard ring region 31*g* is at least partly located outside the anode electrode 71. In other words, in the plane layout, the guard ring region 31*g* is at least partly included in a termination region 40 between the end of the anode electrode 71 and the termination 41*e* of the mesa shape 41. The guard ring region 31*g* has a function of enhancing breakdown voltage under the application of a reverse voltage.

The insulating film 8 continuously extends over the bottom surface 41*b* and the top surface 41*t* to cover the side surface 41*s* and the termination 41*e*, and to further cover a portion of the top surface 41*t* that is adjacent to the termination 41*e*. Furthermore, the insulating film 8 covers the end of the anode electrode 71 on the top surface 41*t*. The insulating film 8 has an opening 80 on the top surface 41*t* where the anode electrode 71 is disposed. In the opening 80, the field plate electrode 10 is connected to the anode electrode 71.

The insulating film 8 in this embodiment is a spin-on-glass (SOG) film. The SOG film is a glass film containing $SiO_2$. The SOG film has a surface that flattens an asperity shape (i.e., the mesa shape 41 in this embodiment) on which the SOG film is disposed. The SOG film is formed through application using a liquid material. This application is typically performed through spin coating.

The mesa shape 41 preferably has a depth (that is, the dimension of the side surface 41*s* in its thickness direction) that is greater than one times the thickness of the insulating film 8 on the bottom surface 41*b* and is smaller than two times the thickness of the insulating film 8 on the bottom surface 41*b*. Here, the thickness of the insulating film 8 on the bottom surface 41*b* (i.e., the dimension in the vertical direction in FIG. 1) can be measured at the boundary between the bottom surface 41*b* and the side surface 41*s*.

The field plate electrode 10 is connected to the anode electrode 71. The field plate electrode 10 faces, via the insulating film 8, the n-type GaN epitaxial-growth layer 2 forming the bottom surface 41*b* of the mesa shape 41. Furthermore, the field plate electrode 10 faces the side surface 41*s* and termination 41*e* of the mesa shape 41 via the insulating film 8. Furthermore, the field plate electrode 10 faces, via the insulating film 8, a portion of the top surface 41*t* that is adjacent to the termination 41*e*. As a result of the planarization effect of the SOG film, which is the insulating film 8, the distance between the field plate electrode 10 and the termination 41*e* is smaller than the distance between the field plate electrode 10 and the bottom surface 41*b*.

In the example in FIG. 1, the trenches 51 include a forward tapered trench, which is the outer trench 51*o*, and a rectangular trench, which is the inner trench 51*i*. Here, a "trench" is a dent shape on the top surface 41*t* of the mesa shape 41. This dent shape has an opening, a bottom, and a sidewall connecting the opening and the bottom together. Further, a "forward tapered trench" herein is a trench having a shape tapered toward its depth direction (i.e., the downward direction in FIG. 1); in other words, a "forward tapered trench" is a trench having an opening greater than its bottom. Still further, a "rectangular trench" herein is a trench having a substantially rectangular shape in cross section; in other words, a "rectangular trench" is a trench having a sidewall substantially parallel to its depth direction. In the inner trench 51*i*, which is a rectangular trench, the anode electrode 71 is in Schottky contact with the n-type GaN epitaxial-growth layer 2. The anode electrode 71 has an end on the top surface 41*t*. This end is away from the side surface 41*s* of the mesa shape 41, and is disposed outside the trenches 51. Moreover, the mesa shape 41 is deeper than the trenches 51.

Figure 3:
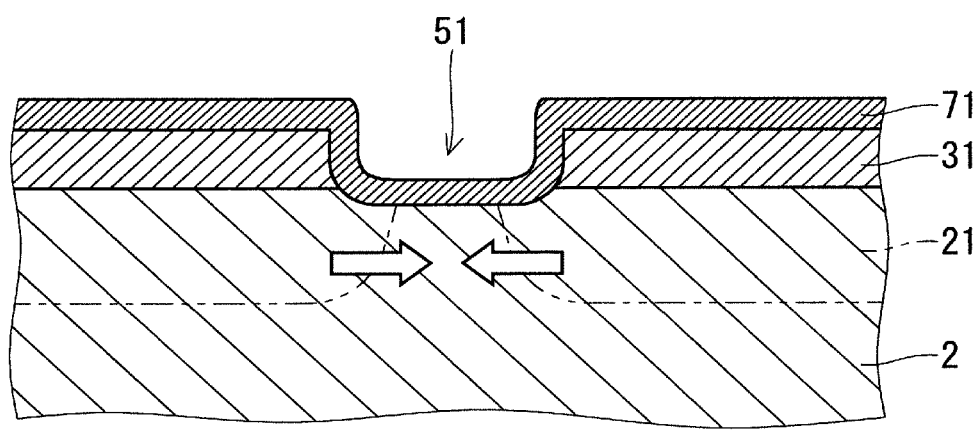
FIG. 3 is a partial cross-sectional view schematically illustrating how depletion layers extend when a reverse voltage is applied across the semiconductor device in FIG. 1.

FIG. 3 is a partial cross-sectional view schematically illustrating how depletion layers 21 extend when a reverse voltage is applied across the diode 91. The adjacent depletion layers 21 are joined as indicated by the arrows in the drawing, thus narrowing a current path. This prevents leakage current. Consequently, the breakdown voltage enhances. The trenches 51 each desirably have a sufficiently small width in order to enhance the breakdown voltage.

It is noted that instead of the n-type GaN substrate 1, a substrate may be used that is made of gallium-nitride-based material other than gallium nitride (GaN). A "galliumnitride-based material" herein is a GaN semiconductor, or a semiconductor with part of Ga atoms in a GaN semiconductor replaced with other atoms. An example of replacement atoms can be at least one of Al and In. Alternatively, a very small amount of impurities for adjusting properties may be added to the gallium-nitride-based material. Such impurities are typically donors or acceptors. The foregoing holds true for the n-type GaN epitaxial-growth layer 2 and the p-type GaN epitaxial-growth layer 31. Further, the outer trench trenches 51*o* may be, for instance, a rectangular trench instead of a forward tapered trench. Still further, the inner trench 51*i* may be, for instance, a forward tapered trench instead of a rectangular trench. Still yet further, the insulating film 8 needs to be an insulating film suitable for easily obtaining desired distribution of the film thickness, and may be thus any film other than an SOG film.

Summary of Effects

According to the present embodiment, the insulating film 8 is filled in the trenches 51, thereby exerting its anchor effect. This prevents the insulating film 8 from peeling. Accordingly, when the kind of the insulating film is selected, emphasis can be put not on peeling prevention, but on the easiness of obtaining the distribution of the film thickness suitable for achieving a high breakdown voltage. This enhances the breakdown voltage through simple manufacturing steps.

To be specific, an SOG film is selected as the kind of the insulating film 8. This easily provides the insulating film 8 with the distribution of the film thickness suitable for achieving a high breakdown voltage. The manufacturing steps are consequently simplified.

The field plate electrode 10 is disposed on the insulating film 8 with a small-thickness distribution suitable for achieving a high breakdown voltage as described above. That is, a slanted field plate structure is provided. This reduces field concentration. The breakdown voltage thus enhances.

The anode electrode 71 is in Schottky contact with the n-type GaN epitaxial-growth layer 2. An SBD structure is accordingly provided. This reduces the turn-on voltage of the diode.

The p-type GaN epitaxial-growth layer 31 is in ohmic contact with the anode electrode 71, and includes the guard ring region 31*g* that is at least partly located outside the anode electrode 71 in the plane layout. A guard ring structure is thus provided. The breakdown voltage thus further enhances.

The mesa shape 41 is preferably rectangular or forward tapered. This further reduces the field concentration at the end of the mesa shape 41 than the mesa shape 41 that is reverse tapered. The breakdown voltage thus further enhances.

The mesa shape 41 preferably has a depth that is greater than one times the thickness of the insulating film 8 on the bottom surface 41*b* of the mesa shape 41 and is smaller than two times the thickness of the insulating film 8 on the bottom surface 41*b* of the mesa shape 41. This facilitates optimizing of the ratio of the thickness of the insulating film 8 on the top surface 41*t* of the mesa shape 41 to the thickness of the insulating film 8 on the bottom surface 41*b* of the mesa shape 41. Consequently, the field concentration is further distributed. The breakdown voltage thus further enhances.

The end of the anode electrode 71 is preferably disposed outside the trenches 51. Consequently, the field concentration at the end the anode electrode 71 is further distributed. The breakdown voltage thus further enhances.

The mesa shape 41 is preferably deeper than the trenches 51. This prevents dielectric breakdown at the corners of the trenches 51 near the side surface of the mesa shape 41. The breakdown voltage thus further enhances.

A forward tapered trench is preferably provided as the outer trench 51*o*. This further enhances the breakdown voltage. Further, a rectangular trench is preferably provided as the inner trench 51*i*. This reduces turn-on resistance, specifically, the turn-on resistance at the Schottky contact. Providing these structures at the same time achieves both the reduction of the turn-on resistance and the enhancement of the breakdown voltage.

(Example of Manufacturing Method)

FIGS. 4 to 10 are cross-sectional views schematically illustrating first to seventh steps included in a method for manufacturing the diode 91 (c.f., FIG. 1). The following describes an example of how to manufacture the diode with reference to these drawings.

Figure 4:
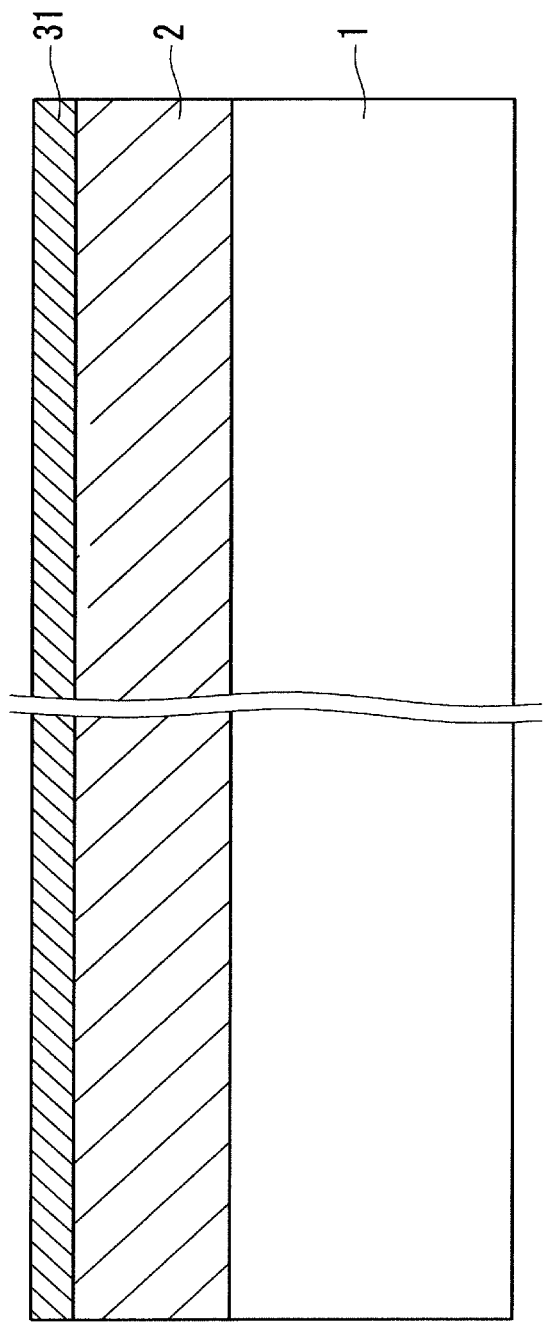
FIG. 4 is a cross-sectional view schematically illustrating a first step included in a method for manufacturing the semiconductor device in FIG. 1.

Referring to FIG. 4, the n-type GaN substrate 1 is prepared as a support substrate that supports the semiconductor layer, which will be described later on. The n-type GaN substrate 1 contains Si dopants at a concentration of $1 \times 10^{18}$ cm$^{-3}$ to be negatively charged. The n-type GaN substrate 1 has a c-plane, i.e., a (0001)-plane as its main surface. The n-type GaN substrate 1 is about 300 µm thick. Next, the n-type GaN substrate 1 is cleaned. Next, the semiconductor layer is deposited onto the n-type GaN substrate 1. To be specific, the n-type GaN epitaxial-growth 2 and the p-type GaN epitaxial-growth layer 31 are sequentially formed through metalorganic vapor-phase epitaxy (MOVPE) or other methods. The n-type GaN epitaxial-growth layer 2 contains Si dopants at a concentration of $1 \times 10^{16}$ cm$^{-3}$. The n-type GaN epitaxial-growth layer 2 is epitaxially grown to be about 15 µm thick. The p-type GaN epitaxial-growth layer 31 contains magnesium (Mg) dopants or beryllium (Be) dopants at a concentration of $1 \times 10^{18}$ cm$^{-3}$. The p-type GaN epitaxial-growth layer 31 is epitaxially grown to be about 800 nm thick. It is noted that the p-type GaN epitaxial-growth layer 31 and the anode electrode 71 are preferably in ohmic contact with each other in order to obtain an MPS diode, which is a diode where a current positively flows through a PN junction under the application of a forward voltage across the diode. To achieve this object, the p-type GaN epitaxial-growth layer 31 may consist of two or more layers having different doping concentrations and different thicknesses. For instance, the p-type GaN epitaxial-growth layer 31 may consist of a lower layer having a doping concentration of $1 \times 10^{18}$ cm$^{-3}$ and a thickness of 800 nm, and an upper layer having a doping concentration of $1 \times 10^{20}$ cm$^{-3}$ and a thickness of 30 nm. The upper layer, having a higher doping concentration, is in contact with the anode electrode 71. This provides better ohmic properties.

Figure 5:
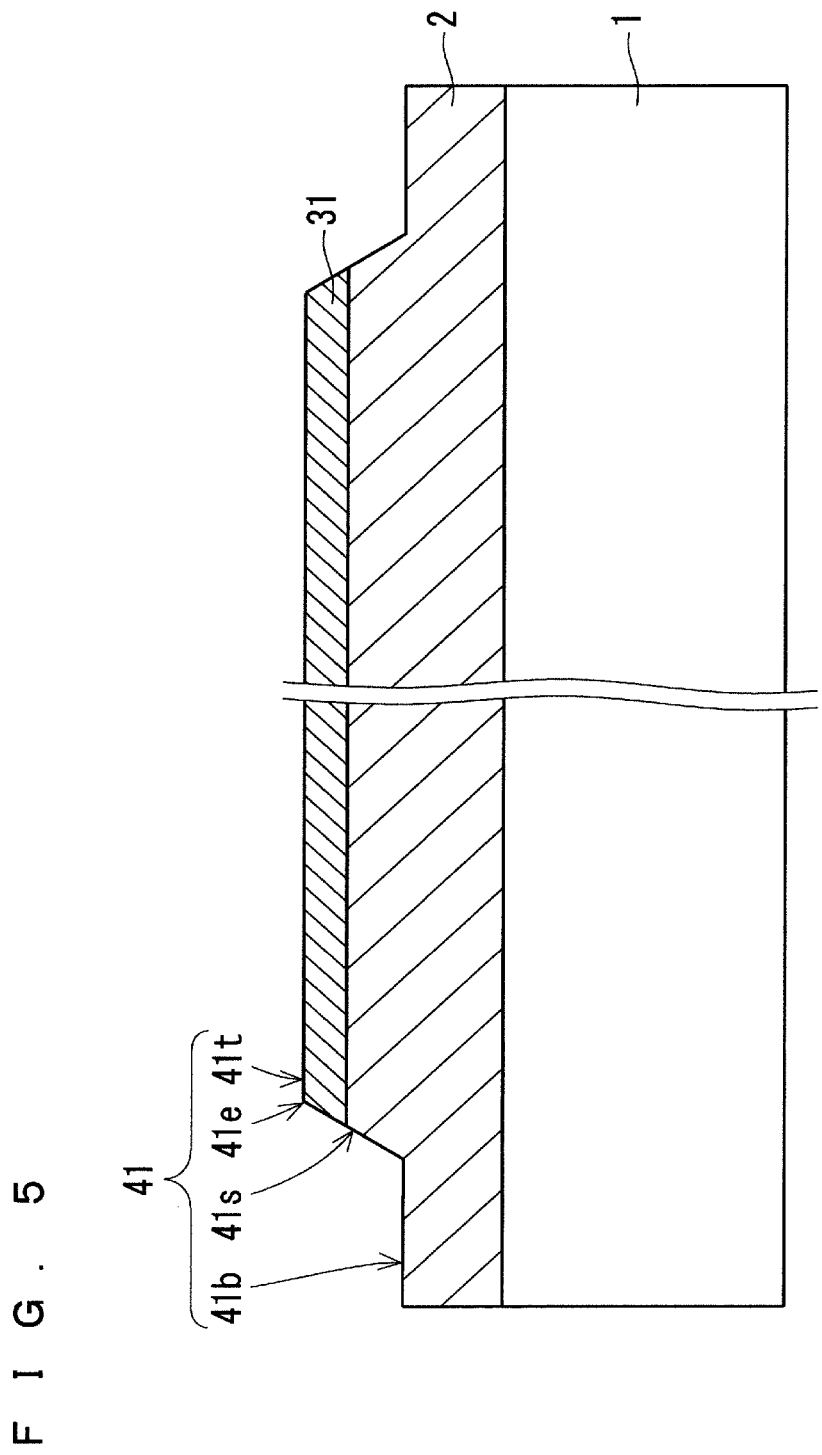
FIG. 5 is a cross-sectional view schematically illustrating a second step included in the method for manufacturing the semiconductor device in FIG. 1.

Referring to FIG. 5, next, the mesa shape 41 is formed through photolithography and dry etching. Examples of a gas for the dry etching include chlorine, boron trichloride, and argon. An object of forming the mesa shape 41 is element separation. Accordingly, the depth of the mesa shape 41 needs to be at least equal to or greater than the p-type GaN epitaxial-growth layer 31, and is typically the order of micrometers. It is noted that the semiconductor layer of GaN can be processed into the mesa shape 41 having a forward tapered shape by processing a mask material (not shown) into a forward tapered shape, followed by dry etching. In this case, the thickness of the mask material decreases toward its end, and the pattern of the mask material thus gradually disappears from its end during the dry etching. This forms the forward tapered mesa shape 41. The top surface 41t has a perimeter of at least 300 μm or more. The aspect ratio of the mesa shape 41 is 1/100 or less. The aspect ratio is indicated by the ratio of the depth dimension of the mesa shape 41 to the maximum dimension of the top surface 41t in plan view.

Figure 6:
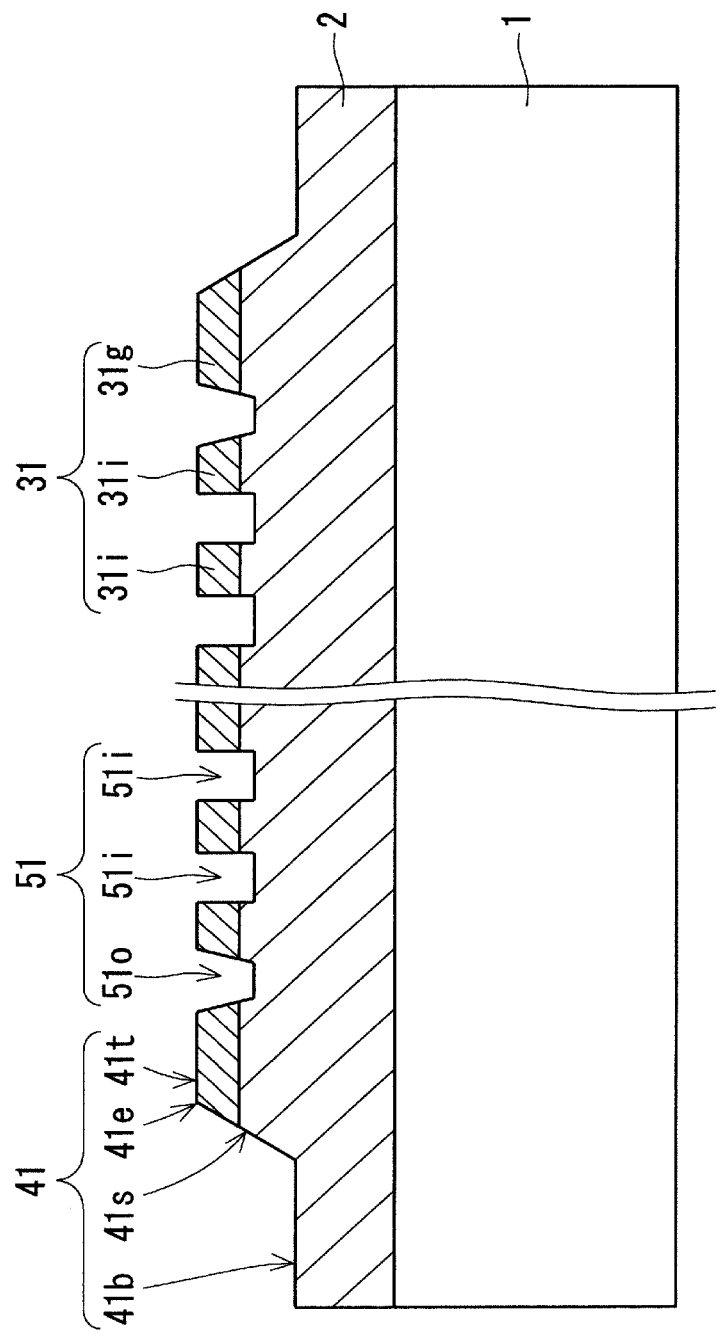
FIG. 6 is a cross-sectional view schematically illustrating a third step included in the method for manufacturing the semiconductor device in FIG. 1.

Referring to FIG. 6, next, the trenches 51 are formed onto the top surface 41t of the mesa shape 41. The aspect ratio of the trenches 51 is greater than 1/100. The aspect ratio is indicated by the ratio of the sidewall height of the trenches 51 to the bottom width of the trenches 51. The trenches 51 are formed through photolithography and dry etching. Unlike the step of forming the mesa shape 41, an etching surface is used as a Schottky interface in the step of forming the trenches 51. As such, excessive etching damage possibly degrades electrical properties. Accordingly, the dry etching for forming the trenches 51 is preferably performed using bias power lower than that in the dry etching for forming the mesa shape 41.

Etching depth is at least equal to or greater than the thickness of the p-type GaN epitaxial-growth layer 31. The bottoms of the trenches 51 are accordingly turned into an SBD region where the n-type GaN epitaxial-growth 2 and the anode electrode 71 are in contact with each other. That is, the SBD region is formed on the n-type GaN substrate 1 provided with a PND structure that consists of the n-type GaN epitaxial-growth layer 2 and the p-type GaN epitaxial-growth 31. Accordingly, the turn-on voltage of the diode depends not on the built-in potential of the PND, but on the Schottky barrier of the SBD. This provides a turn-on voltage lower than that in a pure PND.

The mesa shape 41 and the trenches 51 are separately formed as described above. Such separate formation optimizes pattern shape and etching depth for each of the mesa shape 41 and the trenches 51. For instance, the mesa shape 41 can have a forward tapered shape that exerts an excellent field-diffusion effect, and at least part of the trenches 51 can have a rectangular shape suitable for reducing the turn-on resistance. This achieves both a high level of turn-on resistance and a high level of breakdown voltage. In addition, as illustrated in FIG. 1, the inner trench 51i is rectangular on the top surface 41t of the mesa shape 41, and the outer trench 51o is forward tapered on the top surface 41t of the mesa shape 41. These shapes further enhance the distribution of the field concentration while preventing adverse effects on the turn-on resistance. For reduction in the process steps, a method with a gradation pattern may be used to form such trenches having different shapes in cross section onto the top surface 41t. This method includes forming a dummy pattern onto a photomask to gradually vary the aperture ratio of the pattern, thereby establishing a difference in the amount of light exposure between the upper part and lower part of a resist. The resist is consequently slanted in cross section. The gradation pattern is disposed in a location for forming the forward tapered trench; in addition, a standard pattern is disposed in a location for forming the rectangular trench. Accordingly, both kinds of trench are formed simultaneously.

The depth of the mesa shape 41 is preferably greater than one times the depth of the trenches 51 and smaller than two times the depth of the trenches 51, and is more preferably greater than 1.5 times the depth of the trenches 51 and smaller than two times the depth of the trenches 51. The mesa shape 41 near the termination 41e is deeper than the trenches 51. Accordingly, a depletion layer with a sufficient thickness extends from the side surface 41s of the mesa shape 41 to the outer trench 51o. Consequently, the field concentration reduces at the corner the outer trench 51o. This prevents dielectric breakdown near the corner. On the other hand, the mesa shape 41, if being too deep, can cause an application failure in the formation of the SOG film, and a disconnection in the formation of the field plate electrode 10. It is noted that the mesa shape 41 and the trenches 51 may be formed simultaneously when a reduction in the process steps is prioritized. In this case, the trenches 51 are almost as deep as the mesa shape 41.

After the substrate cleaning, the p-type GaN epitaxial-growth layer 31 undergoes heating for activation. The p-type GaN epitaxial-growth layer 31 needs to be heated at high temperature to a certain degree to eliminate unnecessary hydrogen. For instance, the p-type GaN epitaxial-growth layer 31 undergoes heating at about 700° C. in a nitrogen atmosphere under normal pressure. Although facilitating hydrogen elimination, a higher temperature in heating promotes nitrogen elimination as well due to GaN decomposition. The more nitrogen is eliminated, the more donor defects are produced. With acceptor compensation, a donor defect lowers the activation rate of the p-type GaN epitaxial-growth layer 31. Hence, such a donor defect should be avoided as much as possible. For heating under the normal-pressure atmosphere, the heating temperature needs to be equal to or less than 850° C. at maximum.

More preferably, the p-type GaN epitaxial-growth layer 31 may undergo heating not under the nitrogen normal-pressure atmosphere, but under a nitrogen pressurized atmosphere. This prevents the nitrogen elimination from GaN, thereby enabling heating at high temperature. As a result, the damage from the dry etching sufficiently recovers. The electrical properties consequently improve. The heating under the nitrogen pressurized atmosphere is performed under, for instance, the following condition: 1000° C., 0.6 Mpa, and 10 minutes. To further prevent the nitrogen elimination, a cap film (not shown), such as a SiN film, may be formed before this additional heating.

Figure 7:
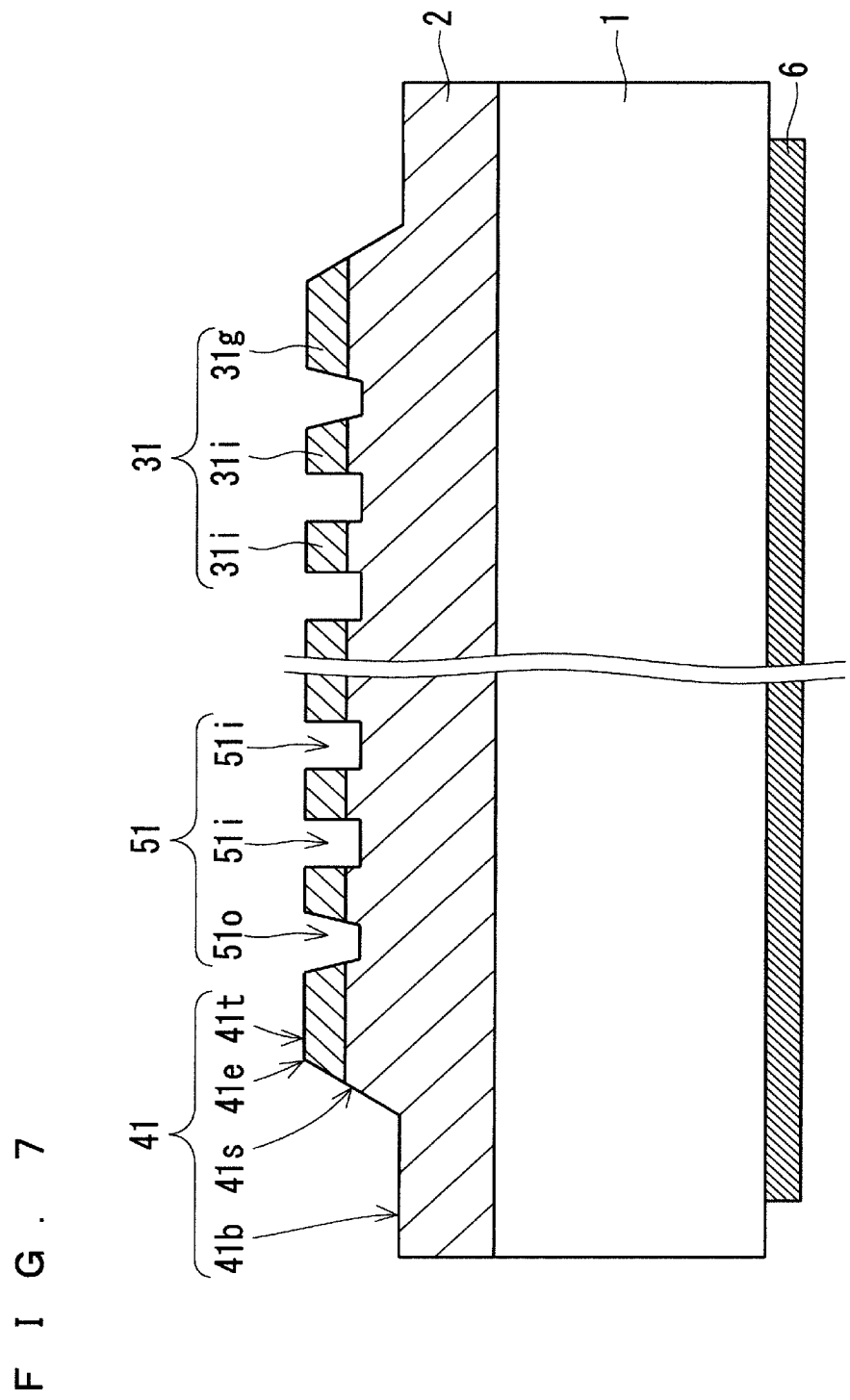
FIG. 7 is a cross-sectional view schematically illustrating a fourth step included in the method for manufacturing the semiconductor device in FIG. 1.

Referring to FIG. 7, next, the cathode electrode 6 is formed onto the lower surface of the n-type GaN substrate 1. The cathode electrode 6 is formed through sputtering, electron-beam (EB) evaporation, resistance heating, or other methods. The cathode electrode 6 is formed of a metal film having a stacked structure containing at least one or more of titanium (Ti), aluminum (Al), molybdenum (Mo), niobium (Nb), platinum (Pt), nickel (Ni), gold (Au), palladium (Pd), and copper (Cu). This metal film undergoes patterning, followed by heating at about 500 to 850° C., thus brining the n-type GaN substrate 1 and the cathode electrode 6 into ohmic contact with each other. This process, although may be performed under a normal-pressure atmosphere, is preferably performed under a nitrogen pressurized atmosphere in order to prevent the pyrolysis of GaN. It is noted that when the reduction in the process steps is prioritized, this process may be performed collectively along with sintering of the anode electrode 71, which will be described later on. It is also noted that when emphasis is laid on the reduction in the turn-on resistance, the lower surface of the n-type GaN substrate 1 may undergo grinding before the cathode electrode 6 is formed, to thus reduce the thickness of the n-type GaN substrate 1.

Figure 8:
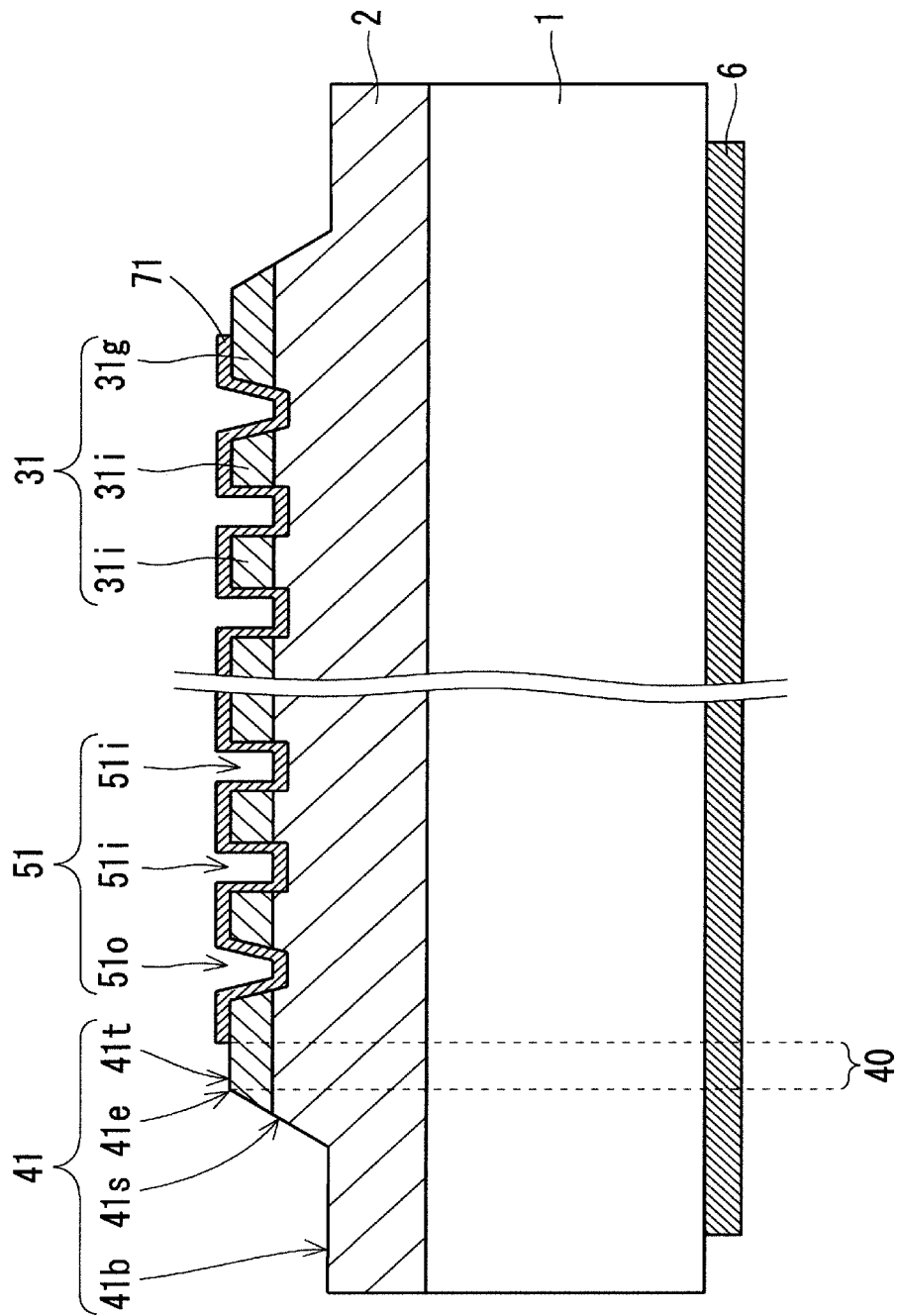
FIG. 8 is a cross-sectional view schematically illustrating a fifth step included in the method for manufacturing the semiconductor device in FIG. 1.

Referring to FIG. 8, next, the anode electrode 71 is formed onto the top surface 41t of the mesa shape 41 to cover the entire trenches 51. For this, a method that involves less damage in the film formation is suitable; example of such a method includes EB evaporation, resistance heating, and plating. Next, the anode electrode 71 undergoes patterning.

As earlier described, high bias power is commonly used in the dry etching for forming the mesa shape 41. Higher bias power is suitable for high manufacture efficiency, particularly when the mesa shape 41 is deeper than the trenches 51. As a result, the etching can considerably damage not only the bottom surface 41b and the side surface 41s of the mesa shape 41, but also a region near the termination 41e on the top surface 41t (e.g., a region between the termination 41e and a position about 3 µm away from the termination 41e). If the anode electrode 71 is in contact with such a region, the leakage current increases, thus possibly reducing the breakdown voltage. For this reason, the termination 41e and the end of the anode electrode 71 are preferably away from each other on the top surface 41t as much as possible, and are preferably away from each other by at least 2 µm or more. In other words, the terminal region 40 preferably has a sufficiently large width. The guard ring region 31g of the p-type GaN epitaxial-growth layer 31 accordingly functions as a guard ring that reduces the field concentration. For the same reason, the end of the anode electrode 71 is preferably disposed on a surface that has not been etched. The end of the anode electrode 71 is thus preferably disposed outside the trenches 51.

For processing the diode 91 into an MPS diode, the anode electrode 71 may undergo ohmic sintering after the patterning, to bring the anode electrode 71 and the p-type GaN epitaxial-growth layer 31 into ohmic contact with each other. This process, however, may be unnecessary when the process seems to increase reverse leakage current resulting from the deterioration of the Schottky interface between the anode electrode 71 and the n-type GaN epitaxial-growth layer 2. The anode electrode 71 is formed of a stacked structure containing at least one or more of Ti, Al, Mo, Nb, Pt, Ni, Au, Pd, and Cu.

Figure 9:
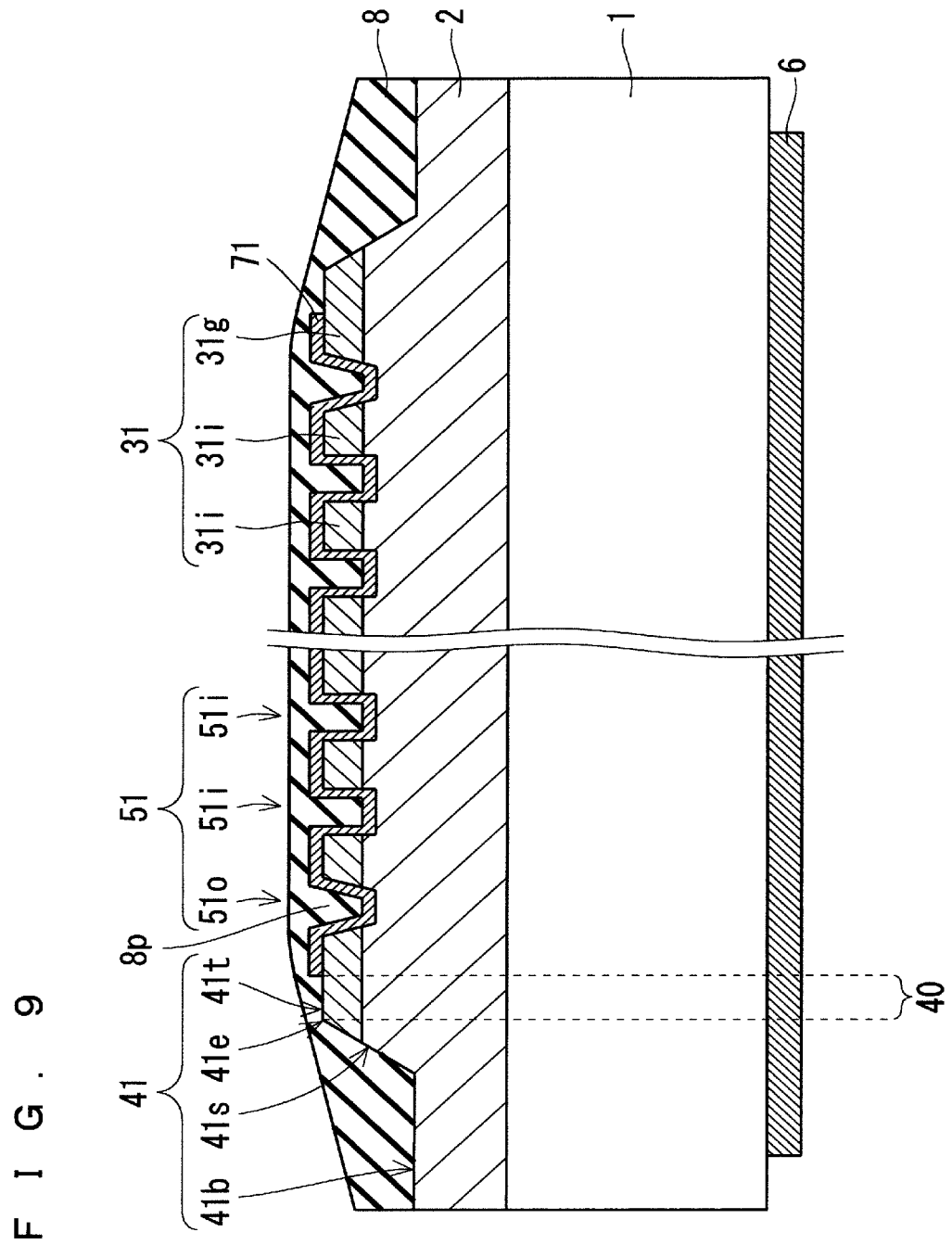
FIG. 9 is a cross-sectional view schematically illustrating a sixth step included in the method for manufacturing the semiconductor device in FIG. 1.

Referring to FIG. 9, next, the insulating film 8 is deposited to completely cover the mesa shape 41. In order for the field plate electrode 10 (c.f., FIG. 1) to have a slanted shape, an SOG film, which is an application film that exerts a planarization effect, is used as the insulating film 8. When the SOG film needs to be formed thickly in particular, the SOG film undergoes application of a liquid material a plurality of times. If the SOG film, however, has an average thickness equal to or greater than the depth of the mesa shape 41, the SOG film excessively extends over the top surface 41t, and is thus too thick on the top surface 41t. This degrades effects of the slanted field plate. As such, the SOG film preferably has a thickness smaller than the depth of the mesa shape 41. If the mesa shape 41 is too deep, on the other hand, the mesa shape 41 forms a large step, thereby easily causing a disconnection in the field plate electrode 10 and the peeling of the SOG film. For this reason, the depth of the mesa shape 41 is preferably greater than one times the thickness of the SOG film and smaller than two times the thickness of the SOG film. Such a configuration enables the insulating film 8 on the top surface 41t of the mesa shape 41 to have a thickness of only about one-third of the thickness of the insulating film 8 on the bottom surface 41b of the mesa shape 41. This enhances the distribution of the field concentration. In some cases, the SOG film have some cracks during formation, after annealing and curing. To avoid cracking, it is preferable to reduce the shrinkage of the SOG film in combination with a curing step other than heating, such as an ultraviolet (UV) process or a plasma process.

Figure 10:
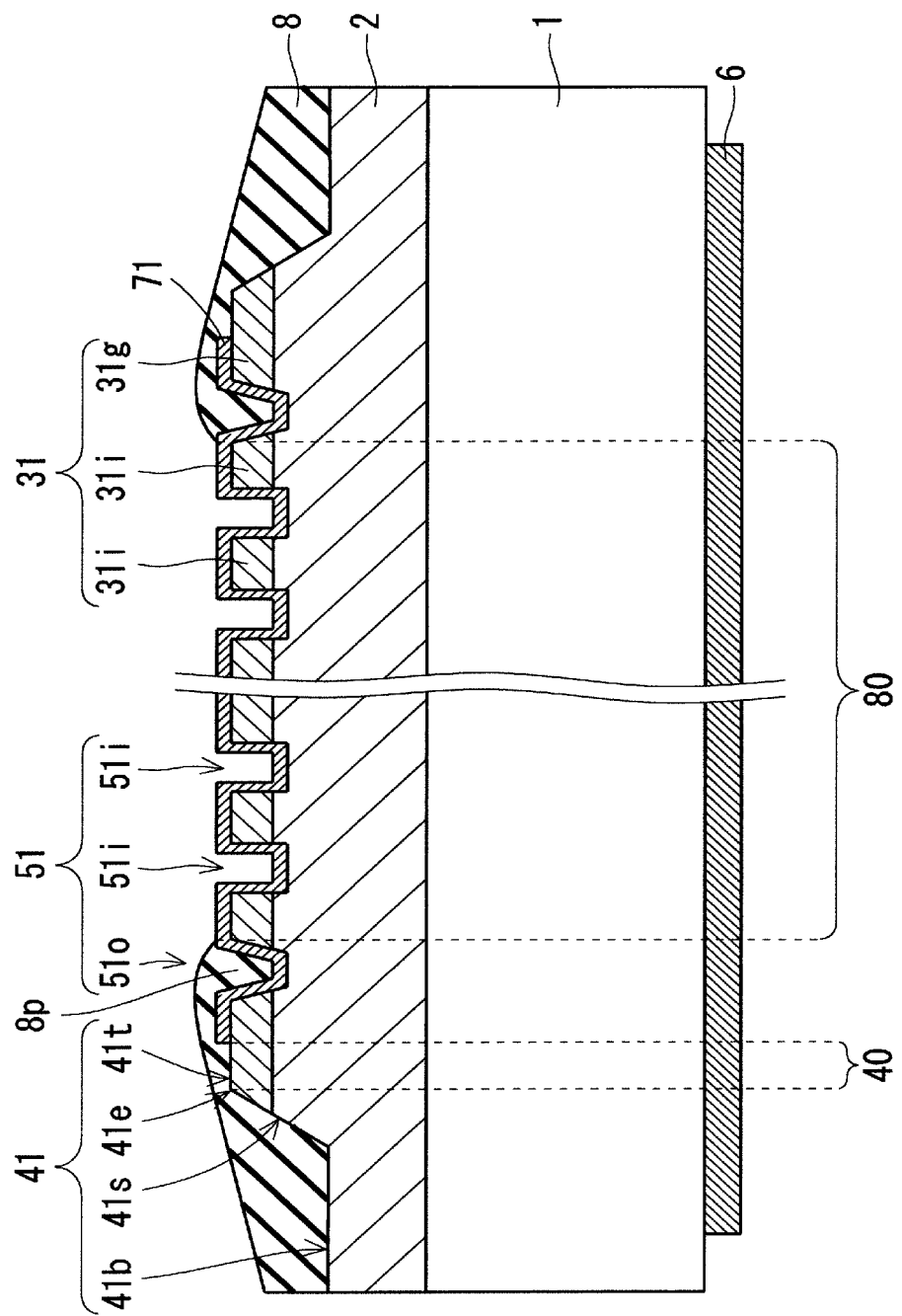
FIG. 10 is a cross-sectional view schematically illustrating a seventh step included in the method for manufacturing the semiconductor device in FIG. 1.

Referring to FIG. 10, next, the opening 80 is formed in the insulating film 8 through photolithography and dry etching. The opening 80 functions as a contact hole that communicates with the anode electrode 71. P-type GaN is commonly apt to become inert due to the damage from etching. In the present embodiment, the p-type GaN epitaxial-growth layer 31, which is covered with the anode electrode 71, is protected from the etching damage. Further, the anode electrode 71 can be used as an etching stopper. It is noted that the etching for forming the opening 80 is not limited to dry etching; for instance, wet etching with buffered hydrofluoric acid may be used.

The opening 80 on the top surface of the mesa shape 41 is located inside part of the trenches 51 (to be specific, the outer trench 51o). Thus, the insulating film 8 accumulates (i.e., an SOG accumulates) in the trenches 51. Accordingly, the anchor structure 8p is formed in the insulating film 8. This improves the adhesion between the top surface 41t and the insulating film 8 having a small thickness on the top surface 41t. This prevents the peeling of the insulating film 8 on the top surface 41t. In particular, when the insulating film 8 consists of an SOG film that exerts a planarization effect, the adhesion improvement enables the insulating film 8 to have a small thickness at the end of the anode electrode 71 and have a large thickness on the bottom surface 41b of the mesa shape 41. This enhances the effects of the field plate electrode 10 (c.f., FIG. 1). Consequently, the breakdown voltage further improves. It is preferable that the opening 80 on the top surface 41t of the mesa shape 41 be located inside the outer trench 51o and encompass the inner trench 51i.

The anode electrode 71 is disposed also under the anchor structure 8p. Accordingly, a portion of the semiconductor layer under the anchor structure 8p, as well, is used as an active layer. This prevents increase in the turn-on resistance due to the anchor structure. Consequently, the adhesion of the insulating film 8 improves, and at the same time, the turn-on resistance reduces.

Referring back to FIG. 1, next, the field plate electrode 10 is formed by forming a resist pattern through photolithography, by forming a film to be an electrode, and by lift-off. The electrode is formed of a stacked structure containing at least one or more of Ti, Al, Mo, Nb, Pt, Ni, Au, Pd, and Cu. The diode 91 is obtained through these process steps. It is noted that the foregoing specific manufacturing method is just one example; another manufacturing method may be used.

(Modification)

Figure 11:
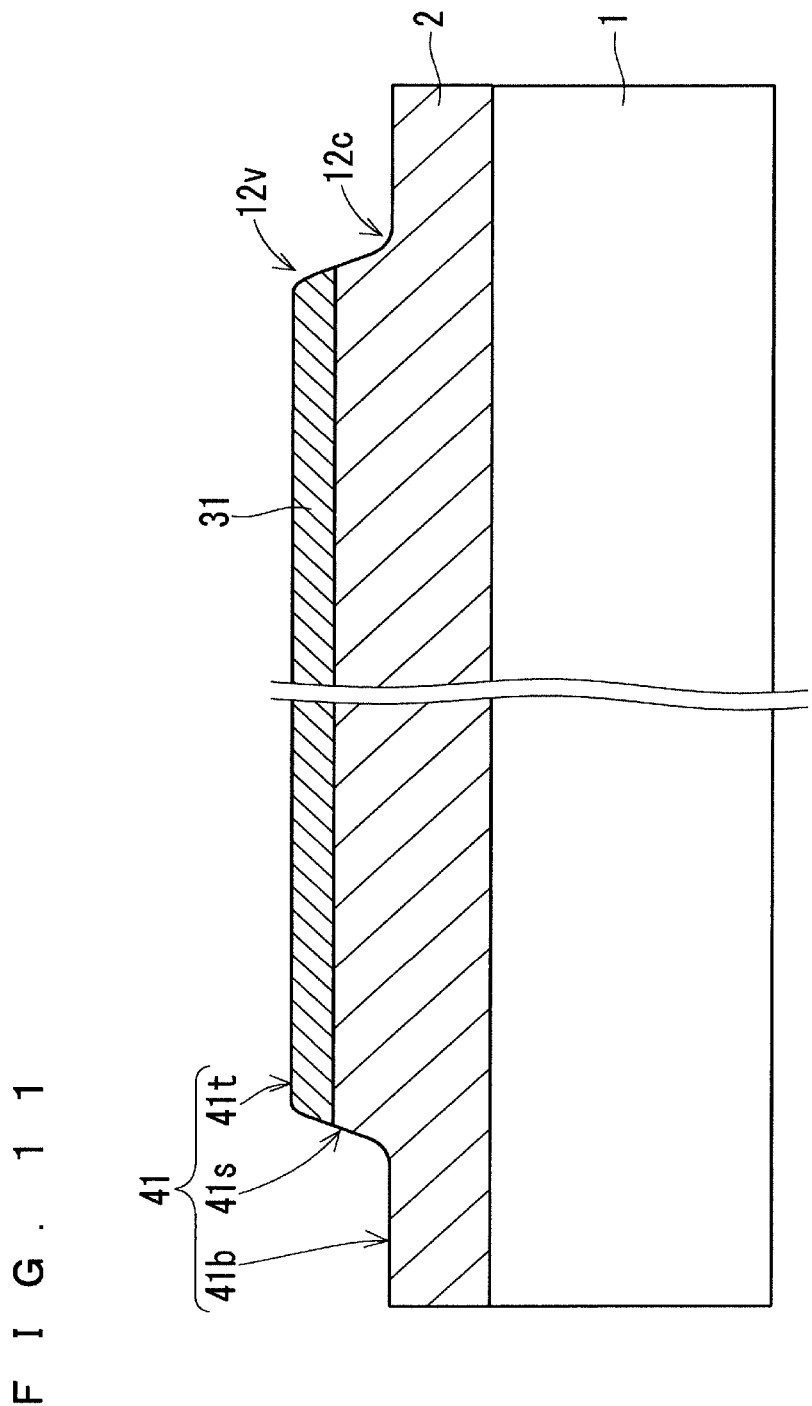
FIG. 11 is a cross-sectional view illustrating a first modification of the process step in FIG. 5.

FIG. 11 is a cross-sectional view illustrating a first modification of the process step in FIG. 5. In this example, the mesa shape 41 has a corner 12v processed into a round shape. The corner 12v is a protrusion between the top surface 41t and the side surface 41s. The mesa shape 41 also has a corner 12c processed into a round shape. The corner 12c is a recess between the side surface 41s and the bottom surface 41b. Such corner rounding further prevents the field concentration.

Figure 12:
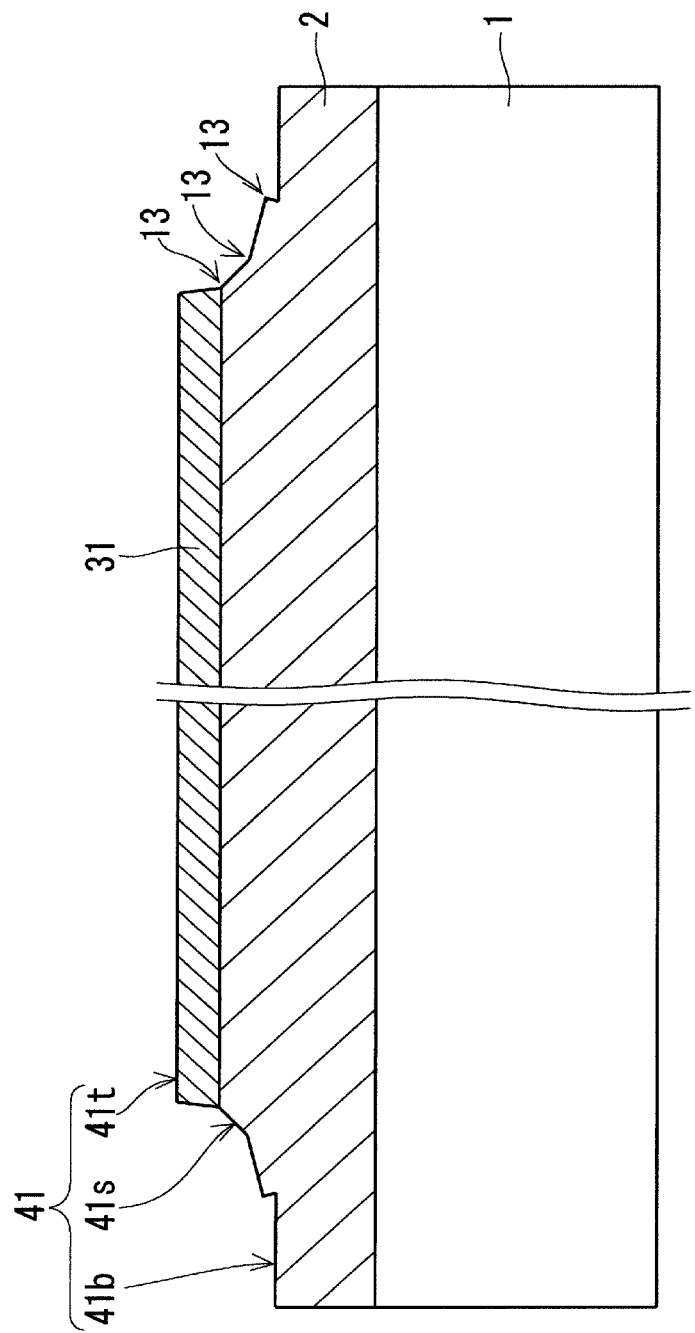
FIG. 12 is a cross-sectional view illustrating a second modification of the process step in FIG. 5.

FIG. 12 is a cross-sectional view illustrating a second modification of the process step in FIG. 5. In this example, the mesa shape 41 has corners 13 in a position on the side surface 41s of the mesa shape 41, away from the top surface 41t and the bottom surface 41b.

Figure 13:
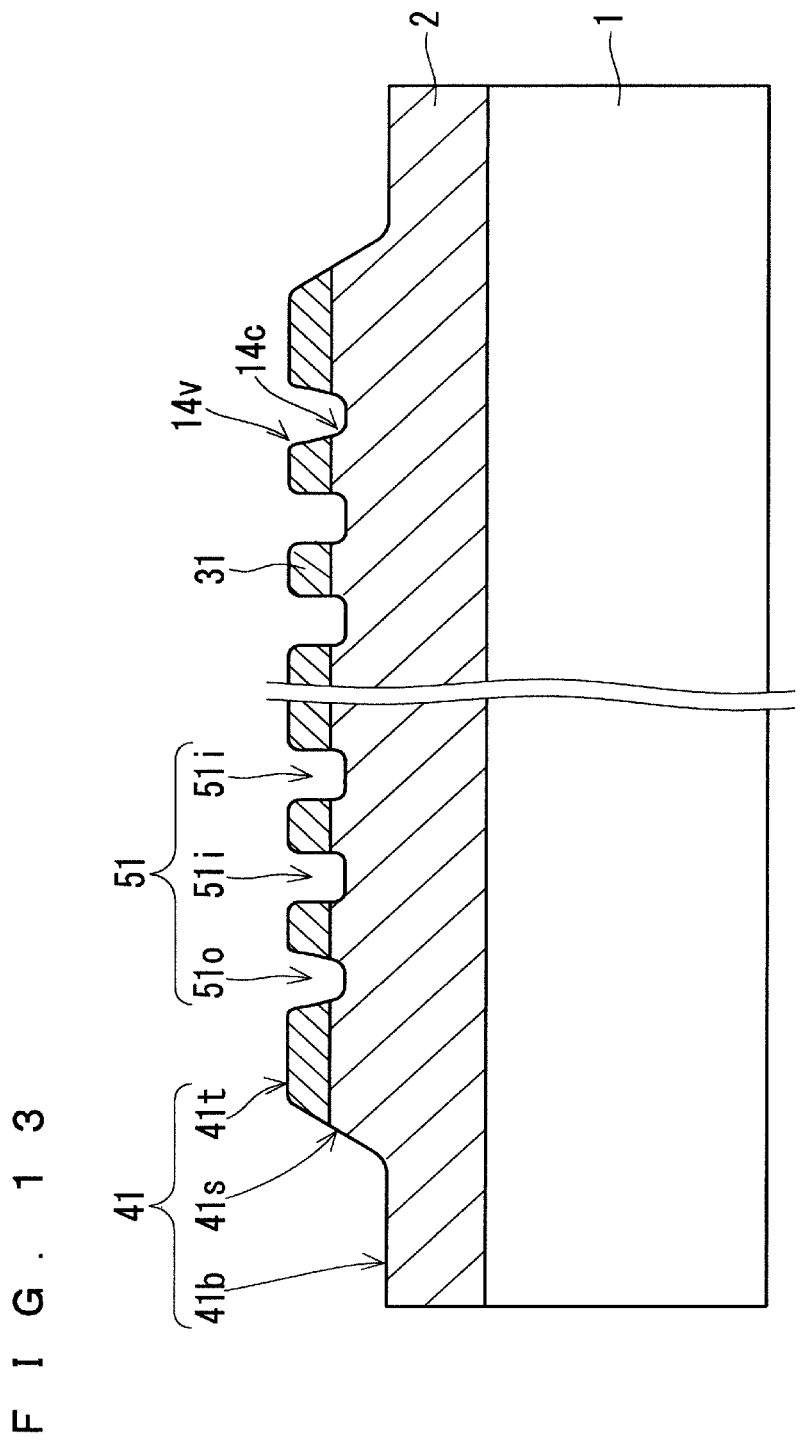
FIG. 13 is a cross-sectional view illustrating a modification of the process step in FIG. 6.

FIG. 13 is a cross-sectional view illustrating a modification of the process step in FIG. 6. In this example, the trenches 51 have corners 14v processed into a round shape. The corners 14v are located at the openings of the trenches 51. The trenches 51 also have corners 14c processed into a round shape. The corners 14c are located between the sidewalls and bottoms of the openings. Such corner rounding further prevents the field concentration.

Figure 14:
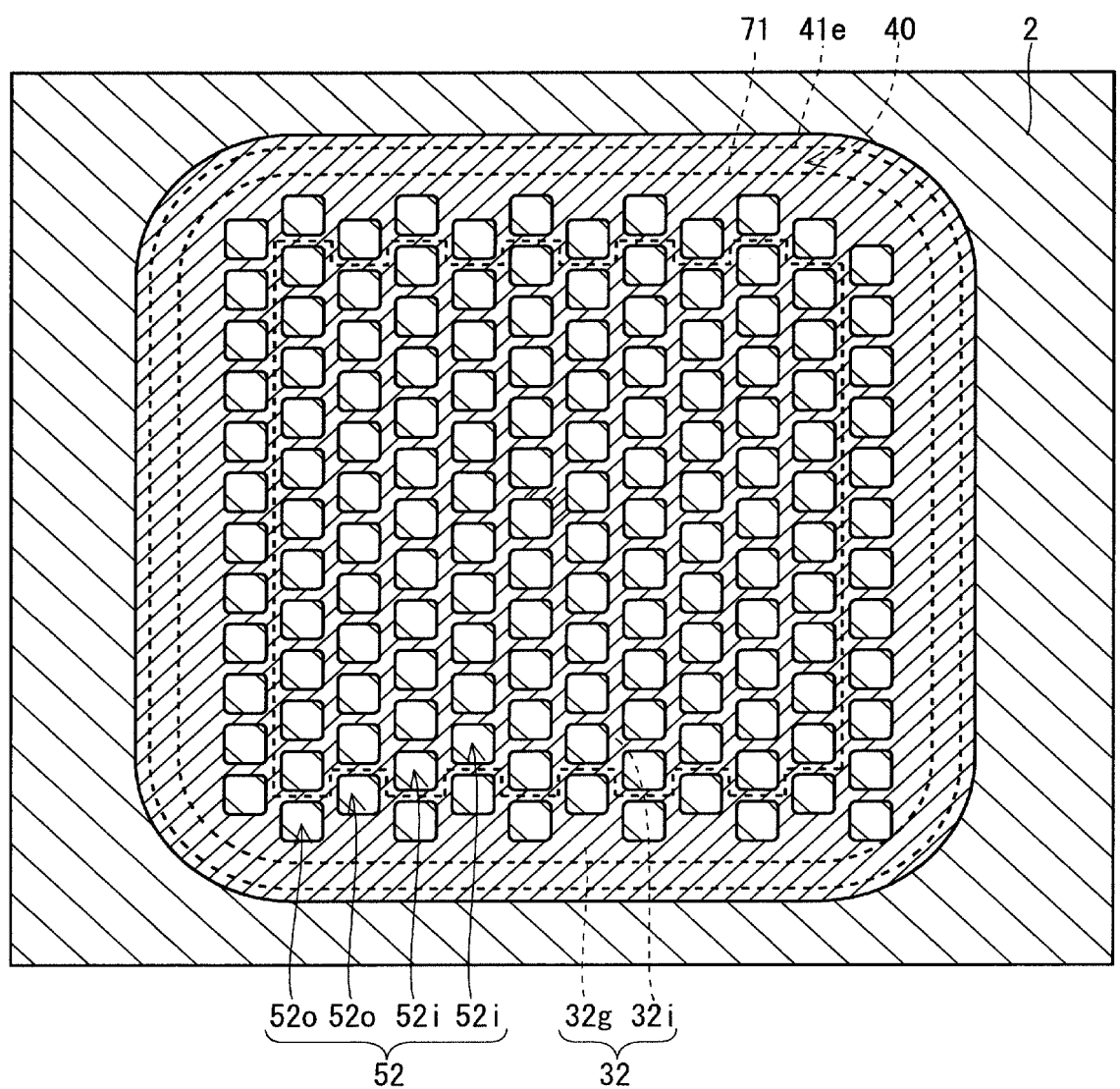
FIG. 14 is a cross-sectional view illustrating a modification of the configuration in FIG. 2.

FIG. 14 is a cross-sectional view illustrating a modification of the configuration in FIG. 2. In this example, trenches 52 in the form of dots are provided instead of the trenches 51 in the form of lines and spaces. The trenches 52 include an outer trench 52o and an inner trench 52i. Further, a p-type GaN epitaxial-growth layer 32 (i.e., p-type layer) is provided instead of the p-type GaN epitaxial-growth layer 31. The p-type GaN epitaxial-growth layer 32 includes a guard ring region 32g where the outer trench 52o is disposed, and an inner region 32i where the inner trench 52i is disposed. In the plane layout, the inner region 32i is disposed inside the guard ring region 32g. The guard ring region 32g, which is almost similar to the guard ring region 31g, functions as a guard ring that reduces the field concentration.

It is noted that the plane layouts of the trenches are not limited to those in FIGS. 2 and 14. Thus, the shape of the guard ring region, as well, is not limited to those in FIGS. 2 and 14; the guard ring region does not necessarily have to have a shape along a closed curve.

Figure 15:
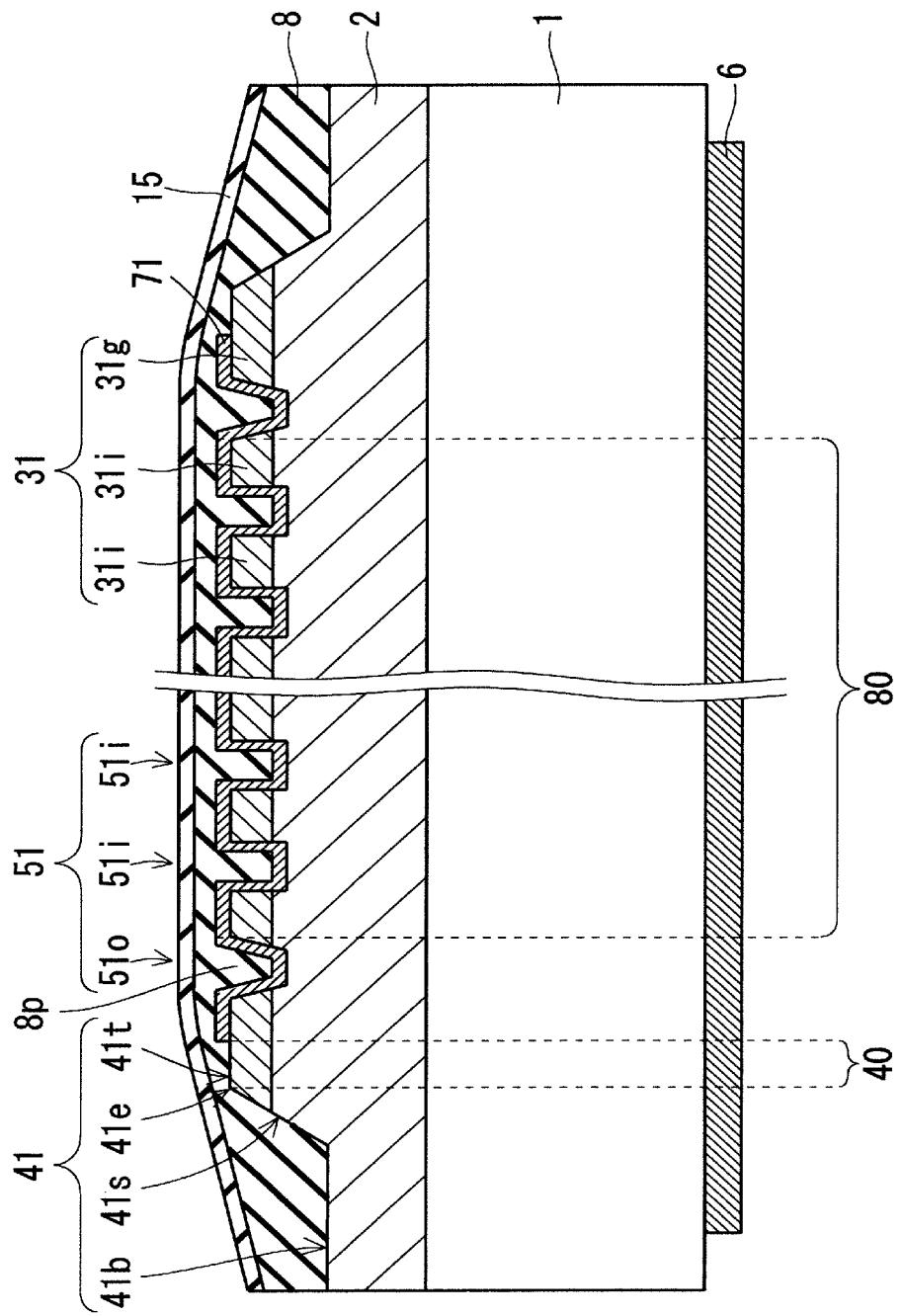
FIG. 15 is a cross-sectional view illustrating a modification of the process step in FIG. 9.
Figure 16:
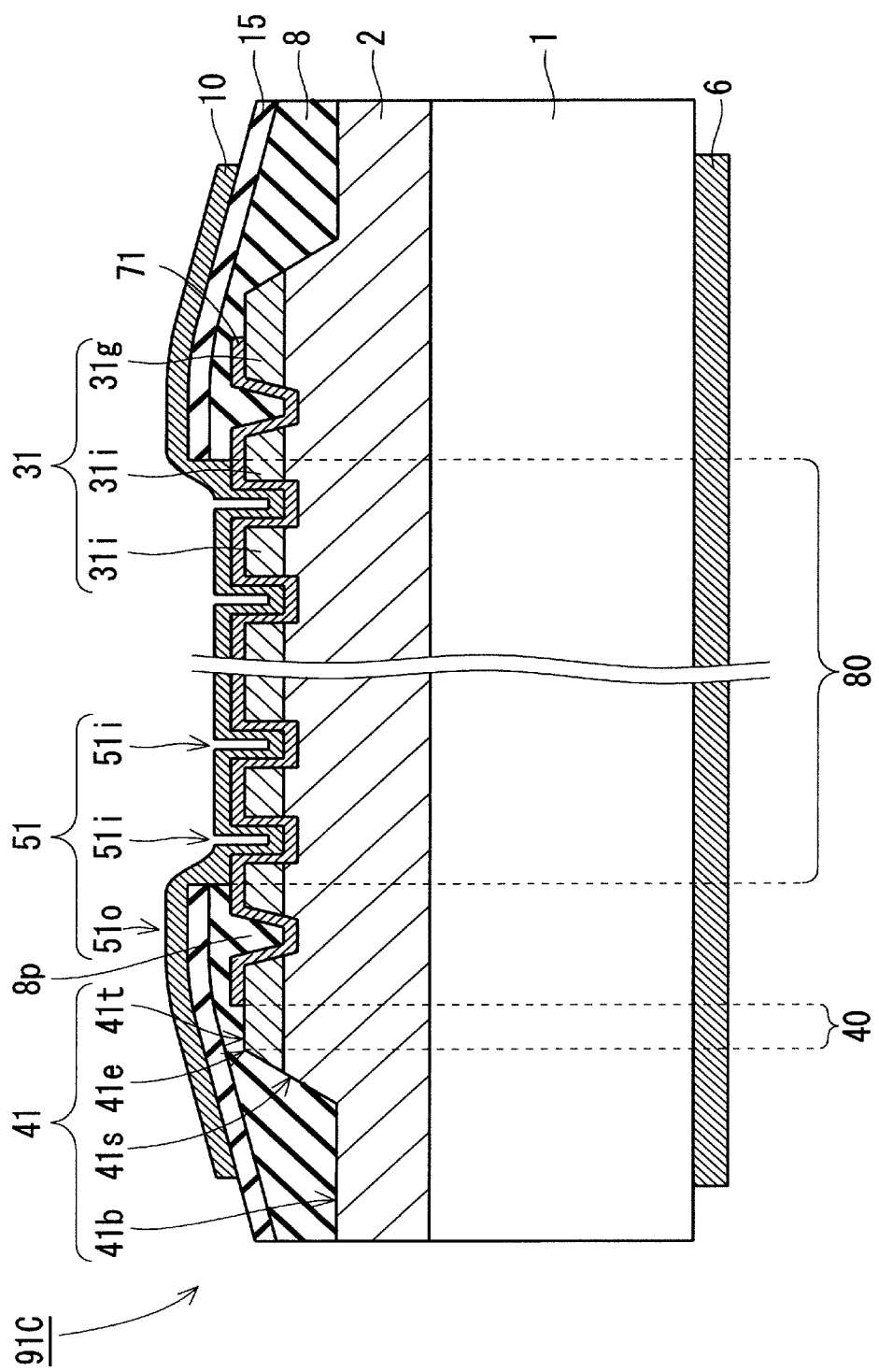
FIG. 16 is a cross-sectional view illustrating a modification of the configuration of the semiconductor device in FIG. 1 that is manufactured using the process step in FIG. 15.

FIG. 15 is a cross-sectional view illustrating a modification of the process step in FIG. 9. FIG. 16 illustrates a diode 91C (i.e., semiconductor device) formed by the process step in the modification. In this example, a cap film 15 consisting of an insulator is formed on an SOG film, which is the insulating film 8. Selecting the material properties of the cap film 15 properly enhances a yield in the process steps relating the SOG film. The cap film 15 is made of, for instance, SiN, SiO$_2$, Al$_2$O$_3$, AlN, AlON, or Ga$_2$O$_3$. Layering the cap film 15 of good coverage thinly onto the SOG film, in particular, enables cracks to be filled. To achieve this object, Al$_2$O$_3$, for instance, is preferably deposited through atomic layer deposition (ALD). Since an SOG film that has been annealed and cured commonly has high liquid repellency, directly applying a resist or other things onto such an SOG film is somewhat difficult. As such, it is preferable that the cap film 15 be formed that is made of material suitable for applying a resist or other things. Layering the cap film 15 having a large thickness, however, degrades the effects of the slanted field plate. Accordingly, the cap film 15 preferably has a thickness of about 5 to 30 nm, and desirably has a thickness of 100 nm or less at maximum.

(Result of Experiment)

FIG. 17 is a graph showing the relationship between reverse voltage (the lateral axis in the drawing) and current density (the vertical axis in the drawing) that were measured with regard to a vertical GaN-SBD, which is the semiconductor device in the embodiment. The inventors got a measurement of 1800 V as the breakdown voltage of a vertical GaN-SBD, which is the highest voltage in the world at the state of the art as far as the inventors know.

Second Embodiment

Figure 18:
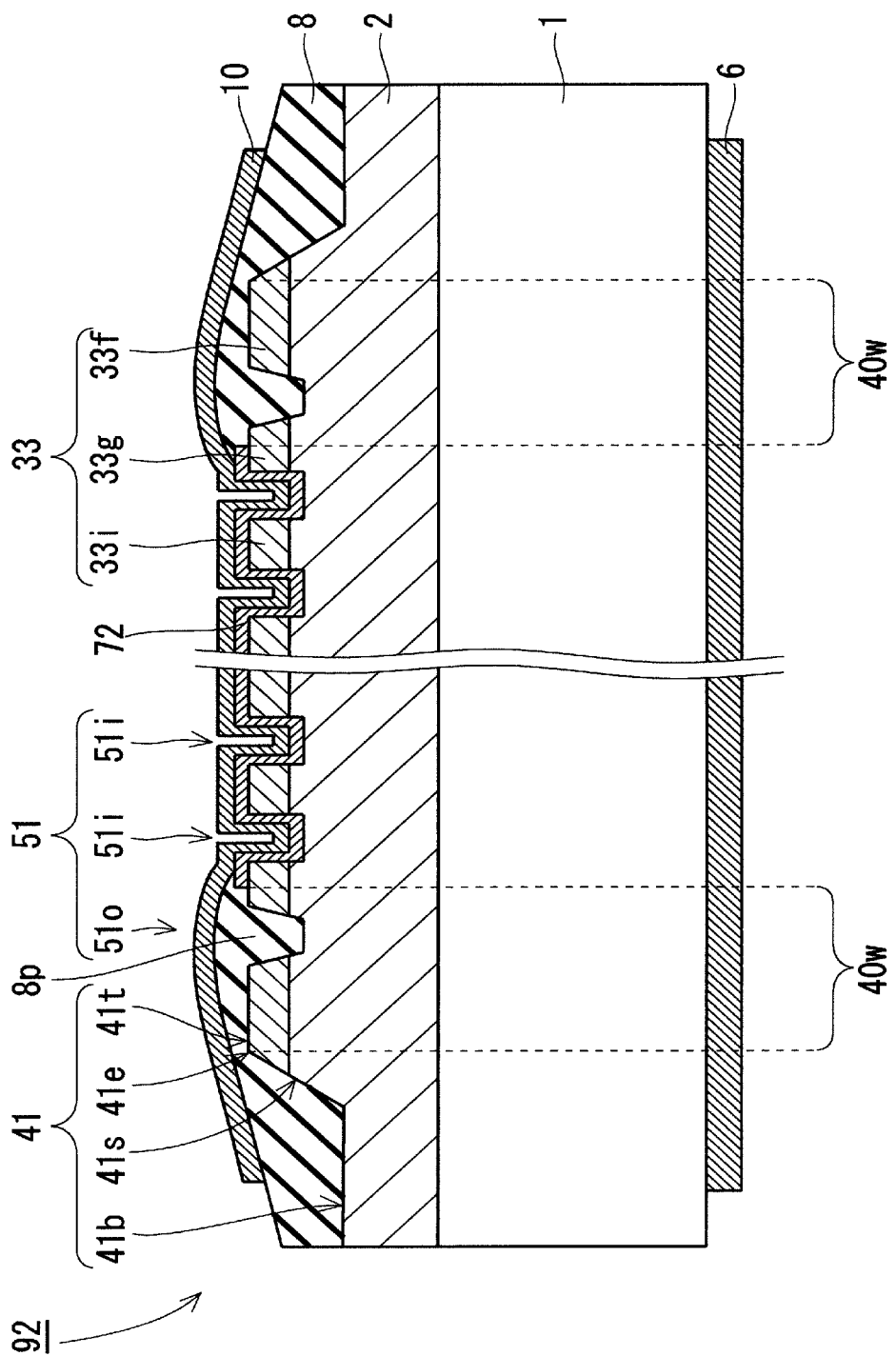
FIG. 18 is a cross-sectional view schematically illustrating the configuration of a semiconductor device according to a second embodiment of the present invention.
Figure 19:
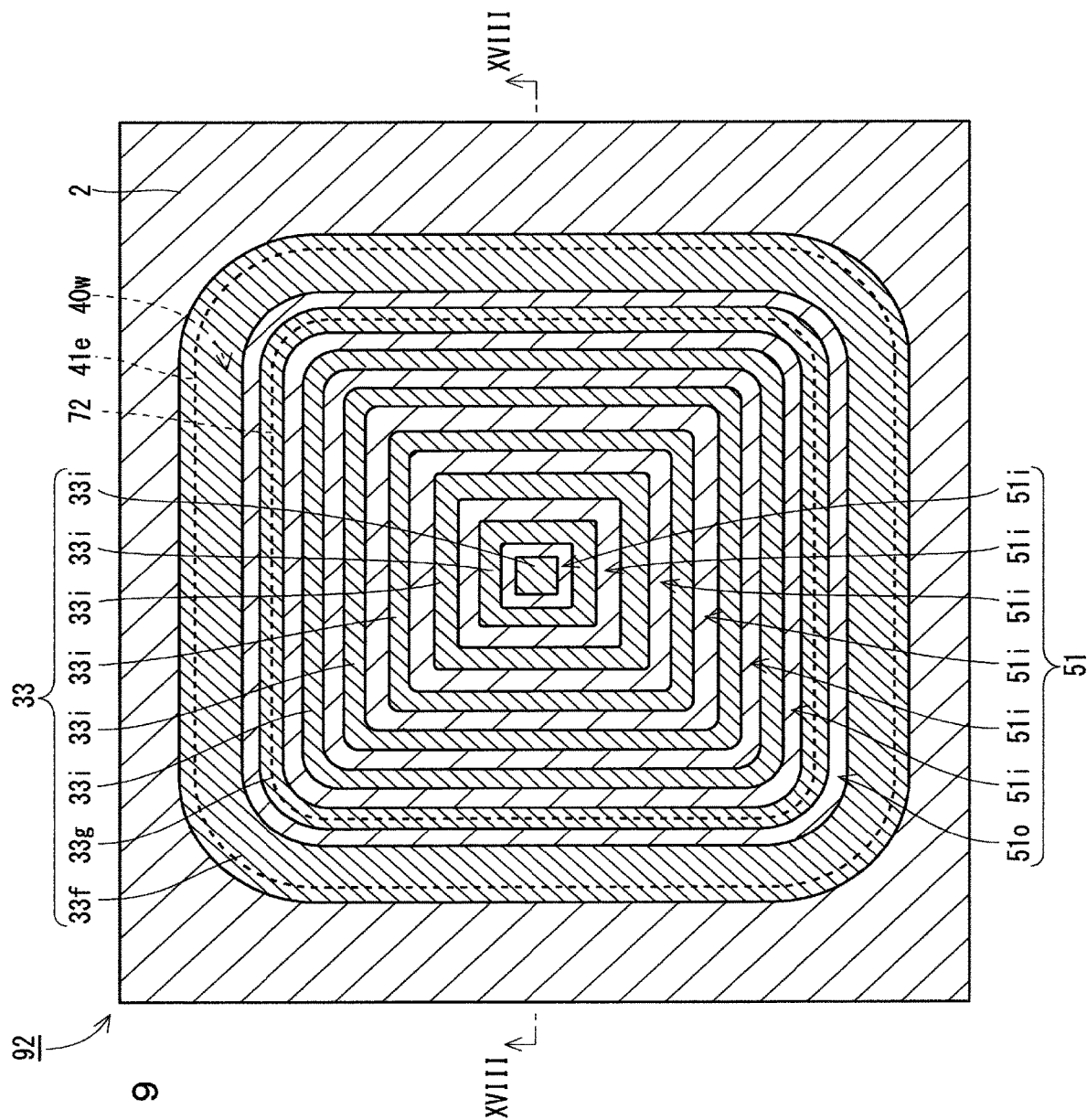
FIG. 19 is a plan view schematically illustrating the configuration of a semiconductor layer included in the semiconductor device in FIG. 18.

FIG. 18 is a cross-sectional view schematically illustrating the configuration of a diode 92 (i.e., semiconductor device) according to a second embodiment. FIG. 19 is a plan view schematically illustrating the configuration of a semiconductor layer included in the diode 92. Although FIG. 19 is a plan view, the drawing is hatched for easy illustration, just as the cross-sectional view in FIG. 18.

The diode 92 has a p-type GaN epitaxial-growth layer 33 (i.e., p-type layer) instead of the p-type GaN epitaxial-growth layer 31 (c.f., FIG. 1; the first embodiment). The p-type GaN epitaxial-growth layer 33 has an inner region 33i, a guard ring region 33g, and a floating ring region 33f. The floating ring region 33f is away from the guard ring region 33g and is disposed outside the guard ring region 33g.

The diode 92 also has, instead of the anode electrode 71, an anode electrode 72 having an end disposed inside the outer trench 51o. The anode electrode 72 is thus disposed outside the outer trench 51o. The diode 92 also has a terminal region 40W between the end of the anode electrode 72 and the termination 41e of the mesa shape 41. Unlike the terminal region 40 (c.f., FIG. 1), the terminal region 40W extends between the outer trench 51o and the inner trench 51i. The inner region 33i and the guard ring region 33g respectively function similarly to the inner region 31i and the guard ring region 31g (c.f., FIG. 1).

The floating ring region 33f is spaced away from the anode electrode 72. The floating ring region 33f is also spaced away from the inner region 33i connected to the anode electrode 72 and from the guard ring region 33g connected to the anode electrode 72. As such, the floating ring region 33f is electrically isolated from the anode electrode 72. The floating ring region 33f is thus not directly affected by the potential of the anode electrode 72. That is, the floating ring region 33f is in electrically floating state. The floating ring region 33f is at least partly located outside the anode electrode 72 in the plan layout, and is as a whole located outside the anode electrode 72 in the present embodiment.

Figure 20:
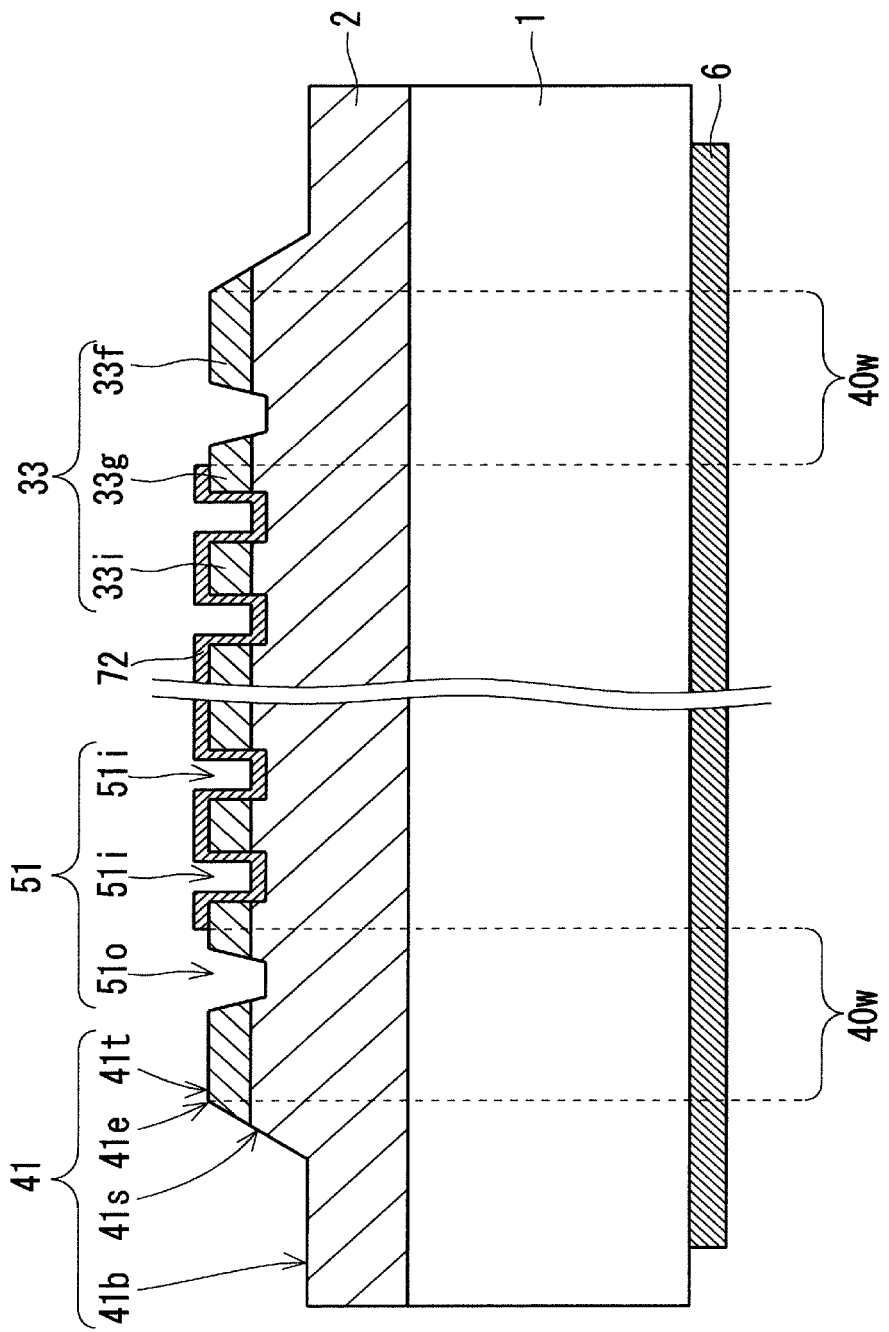
FIG. 20 is a cross-sectional view schematically illustrating a process step included in a method for manufacturing the semiconductor device in FIG. 18.

FIG. 20 is a cross-sectional view schematically illustrating a process step for manufacturing the diode 92. This process step is performed instead of the process step in FIG. 8 in the first embodiment. These process steps are almost similar with the exception that the patterns of the anode electrodes are different.

The other configuration, which is almost the same as that in the first embodiment or the modification of the first embodiment, will not be elaborated upon.

According to the present embodiment, the floating ring region 33f reduces the field concentration. When compared to the anode electrode 71 of the diode 91 (c.f., FIG. 1) in the first embodiment, the anode electrode 72 in the present embodiment has an end located away from the termination 41e of the mesa shape damaged by etching. As a result, turn-on resistance slightly increases, but leakage current further reduces. This further enhances breakdown voltage.

It is noted that although there is only one floating ring region 33f in FIG. 19, a plurality of floating ring regions spaced from each other may be provided in multi-ply form. Accordingly, the leakage current further reduces. In this case, the distance between the floating ring regions needs to be small so that a depletion layer extending from the inner one of the adjacent floating ring regions can reach the outer region.

Third Embodiment

Figure 21:
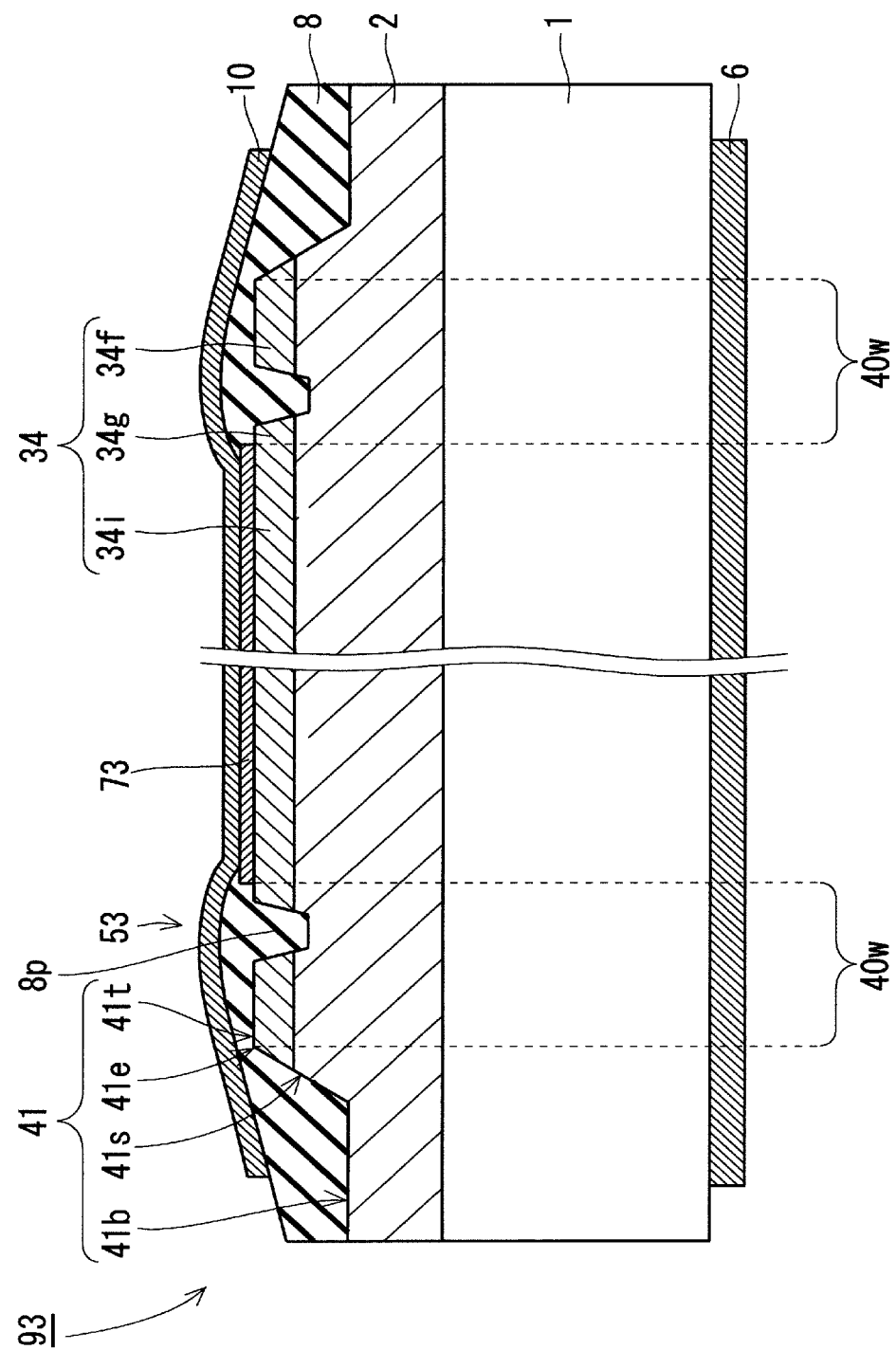
FIG. 21 is a cross-sectional view schematically illustrating the configuration of a semiconductor device according to a third embodiment of the present invention.

FIG. 21 is a cross-sectional view schematically illustrating the configuration of a diode 93 (i.e., semiconductor device) according to a third embodiment. In the present embodiment, provided is a p-type GaN epitaxial-growth layer 34 (i.e., p-type layer) instead of the p-type GaN epitaxial-growth layer 33 (c.f., FIG. 18; the second embodiment). The p-type GaN epitaxial-growth layer 34 has an inner region 34i, a guard ring region 34g, and a floating ring region 34f. The top surface 41t of the mesa shape 41 is provided with a trench 53. The trench 53 is similar to the outer trench 51o (c.f., FIG. 18; the second embodiment). In the present embodiment, no trench corresponding to the inner trench 51i (c.f., FIG. 18) is provided. Instead of the anode electrode 72 (c.f., FIG. 18), an anode electrode 73 is disposed inside the trench 53. No trench is thus provided under the anode electrode 73. As such, the anode electrode 73 is in contact with the p-type GaN epitaxial-growth layer 34, but is not in contact with the n-type GaN epitaxial-growth 2. The anode electrode 73 and the p-type GaN epitaxial-growth layer 34 are in ohmic contact with each other. As such, the diode 93 does not include an SBD structure, and is thus a pure PND.

The other configuration, which is almost the same as that in the first embodiment, the modification of the first embodiment, or the second embodiment, will not be elaborated upon.

According to the present embodiment, the diode 93 is a PND that does not include an SBD structure, unlike the diode 91 (c.f., FIG. 1; the first embodiment) and the diode 92 (c.f., FIG. 18; the second embodiment). The diode 93 consequently has a lower turn-on resistance and a higher breakdown voltage in the basic principle of a PND.

It is noted that in the present invention, the individual embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 n-type GaN substrate (substrate), 2 n-type GaN epitaxial-growth layer (n-type layer), 6 cathode electrode, 8 insulating film, 8p anchor structure, 10 field plate electrode, 15 cap film, 31 to 34 p-type GaN epitaxial-growth layer (p-type layer), 31g, 32g, 33g, 34g guard ring region, 31i, 32i, 33i, 34i inner region, 33f, 34f floating ring region, 40, 40W terminal region, 41 mesa shape, 41b bottom surface, 41e termination, 41s side surface, 41t top surface, 51 to 53 trench, 51i, 52i inner trench, 51o, 52o outer trench, 71 to 73 anode electrode, 80 opening, 91, 91C, 92, 93 diode (semiconductor device).

The invention claimed is:
1. A semiconductor device comprising:
a substrate having a first surface and a second surface opposite to the first surface, and being made of a gallium-nitride-based material;
an n-type layer disposed on the first surface of the substrate, and being made of a gallium-nitride-based material;
a p-type layer disposed on the n-type layer, and being made of a gallium-nitride-based material, the p-type layer constituting, along with the n-type layer, a semiconductor layer on the first surface of the substrate, the semiconductor layer being provided with a mesa shape having a bottom surface, a side surface, and a top surface;
an outer trench disposed along a termination of the top surface, and reaching the n-type layer;
at least one inner trench disposed inside the outer trench on the top surface, and reaching the n-type layer;
an anode electrode disposed on the p-type layer and the n-type layer, the anode electrode having an end that is in Schottky contact with the n-type layer in the outer trench and the inner trench, and is disposed on the top surface, the end being away from the side surface and being disposed outside the outer trench;
a cathode electrode disposed on the second surface of the substrate;
an insulating film continuously extending over the bottom surface and the top surface to cover the side surface, the insulating film filling the outer trench; and
a field plate electrode connected to the anode electrode, the field plate electrode facing, via the insulating film, the anode electrode in the outer trench, and the n-type layer forming the bottom surface.

2. The semiconductor device according to claim 1, wherein the mesa shape is rectangular or forward tapered.

3. The semiconductor device according to claim 1, wherein the insulating film includes a spin-on-glass film.

4. The semiconductor device according to claim 3, further comprising a cap film that is disposed on the spin-on-glass film, and is formed of an insulator.

5. The semiconductor device according to claim 1, wherein the mesa shape has a depth that is greater than one times a thickness of the insulating film on the bottom surface and is smaller than two times the thickness of the insulating film on the bottom surface.

6. The semiconductor device according to claim 1, wherein the mesa shape is deeper than the outer trench and the inner trench.

7. The semiconductor device according to claim 1, wherein the p-type layer includes a guard ring region that is electrically connected to the anode electrode, and is at least partly located outside the anode electrode in a plane layout.

8. The semiconductor device according to claim 1, wherein the insulating film does not fill the inner trench.

9. The semiconductor device according to claim 1, wherein the outer trench is forward tapered.

10. The semiconductor device according to claim 1, wherein the inner trench is rectangular.

* * * * *